United States Patent
Lu et al.

(10) Patent No.: US 12,300,599 B2
(45) Date of Patent: May 13, 2025

(54) METHOD FOR FORMING SEMICONDUCTOR STRUCTURE

(71) Applicant: TAIWAN SEMICONDUCTOR MANUFACTURING COMPANY LTD., Hsinchu (TW)

(72) Inventors: Meng-Pei Lu, Hsinchu (TW); Shin-Yi Yang, New Taipei (TW); Shu-Wei Li, Hsinchu (TW); Chin-Lung Chung, Hsinchu (TW); Ming-Han Lee, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 269 days.

(21) Appl. No.: 17/814,844

(22) Filed: Jul. 26, 2022

(65) Prior Publication Data
US 2022/0359378 A1   Nov. 10, 2022

Related U.S. Application Data

(62) Division of application No. 17/008,141, filed on Aug. 31, 2020, now Pat. No. 11,682,616.

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76802* (2013.01); *H01L 21/7682* (2013.01); *H01L 21/76831* (2013.01); *H01L 21/76843* (2013.01); *H01L 21/76877* (2013.01); *H01L 23/53295* (2013.01)

(58) Field of Classification Search
CPC ............. H01L 29/1606; H01L 23/5226; H01L 23/53295; H01L 21/76895; H01L 21/76802; H01L 21/76843
See application file for complete search history.

(56) References Cited

U.S. PATENT DOCUMENTS

| | | | |
|---|---|---|---|
| 6,287,979 B1* | 9/2001 | Zhou | B82Y 30/00 438/743 |
| 8,647,978 B1* | 2/2014 | Ott | H01L 23/5329 257/781 |
| 11,462,470 B2* | 10/2022 | Yang | H01L 21/76885 |
| 2015/0171314 A1* | 6/2015 | Li | G11C 11/1659 257/421 |
| 2018/0033727 A1* | 2/2018 | Lee | H01L 21/76844 |
| 2018/0164698 A1* | 6/2018 | Yang | G03F 7/0047 |
| 2019/0164781 A1* | 5/2019 | Tien | H01L 23/5283 |
| 2021/0305087 A1* | 9/2021 | Parikh | H01L 21/32139 |

* cited by examiner

*Primary Examiner* — Zandra V Smith
*Assistant Examiner* — John M Parker
(74) *Attorney, Agent, or Firm* — WPAT LAW; Anthony King

(57) ABSTRACT

A method for forming a semiconductor structure includes following operations. A hybrid layered structure is formed. The hybrid layered structure includes at least a 2D material layer and a first 3D material layer. Portions of the hybrid layered structure are removed to form a plurality of conductive features and at least an opening between the conductive features. A dielectric material is formed to fill the opening and to form an air gap sealed within.

20 Claims, 16 Drawing Sheets

METHOD FOR FORMING SEMICONDUCTOR STRUCTURE

PRIORITY DATA

This patent is a divisional application of U.S. patent application Ser. No. 17/008,141 filed on Aug. 31, 2020, entitled of "SEMICONDUCTOR STRUCTURE AND METHOD FOR FORMING THE SAME", the entire disclosure of which is hereby incorporated by reference.

BACKGROUND

The semiconductor integrated circuit (IC) industry has experienced rapid growth. Technological advances in IC materials and design have produced continuous improvements over generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, as the feature sizes continue to decrease, fabrication processes continue to become more difficult to perform. Thus, there is a challenge to form reliable semiconductor devices of smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
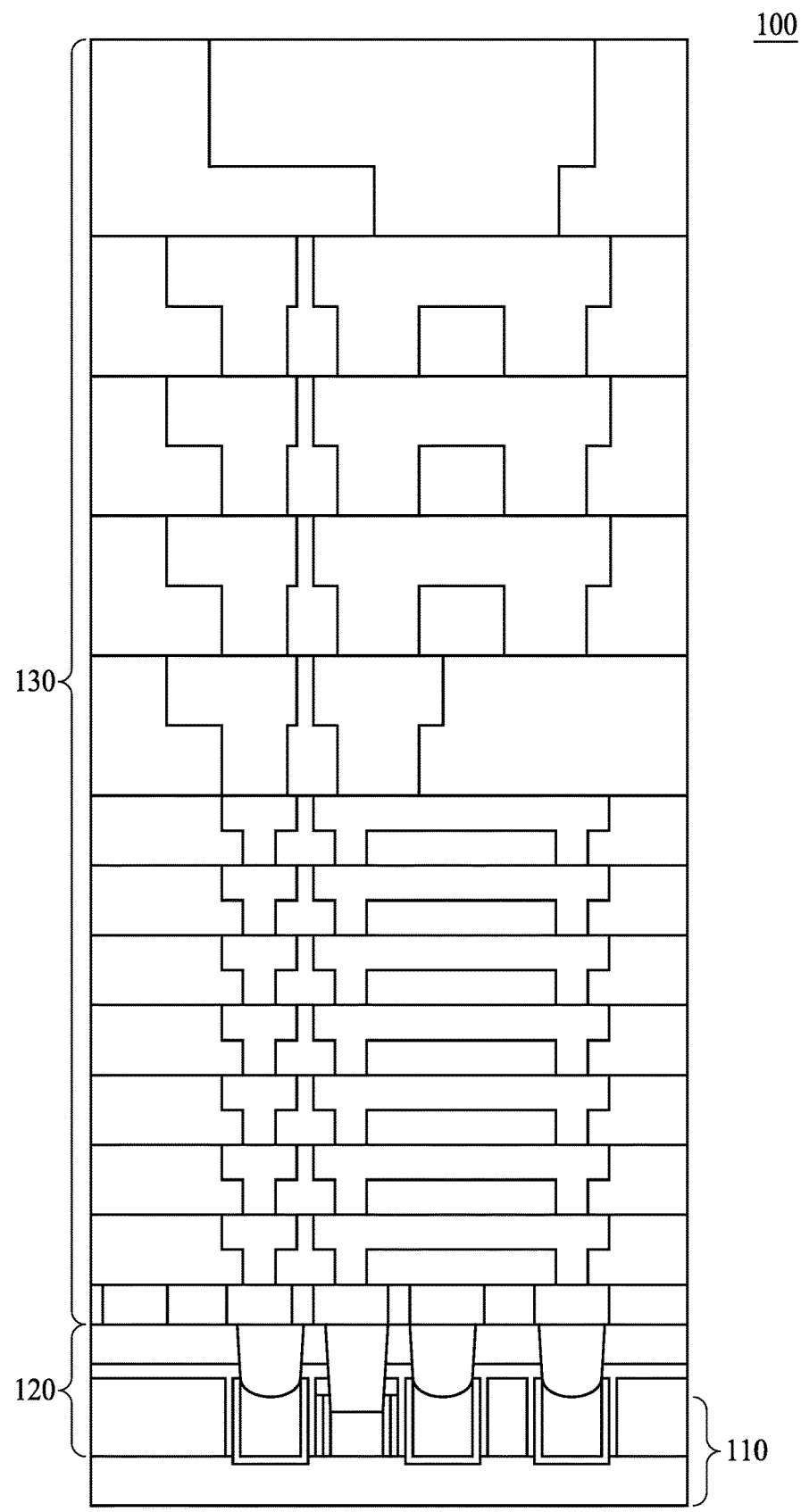
FIG. 1 is a fragmentary cross-sectional view of a semiconductor structure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms such as "2D material" can include multiple sheets or layers, with covalent bonding between atoms of a particular sheet or layer, and weaker interactions, such as Van der Waals bonding, between sheets or layers. In some embodiments, a single-layered material also can be a suitable 2D material. As used herein, the term "3D material" can include 3D crystalline materials as well as layered materials in which at least some extent of covalent bonding occurs between sheets or layers of the layered materials.

An IC manufacturing process flow can typically be divided into three categories: front-end-of-line (FEOL), middle-end-of-line (MEOL) and back-end-of-line (BEOL) processes. FEOL generally encompasses processes related to fabrication of IC devices, such as transistors. For example, FEOL processes can include forming isolation structures for isolating IC devices, gate structures, and source and drain structures (also referred to as source/drain structures) that form a transistor. MEOL generally encompasses processes related to fabrication of semiconductor structures (also referred to as contacts or plugs) that connect to conductive features (or conductive regions) of the IC devices. For example, MEOL processes can include forming connecting structures that connect to the gate structures and connecting structures that connect to the source/drain structures. BEOL generally encompasses processes related to fabrication of multilayer interconnect (MLI) structures that electrically connect the IC devices and the connecting structures fabricated by FEOL and MEOL processes. Accordingly, operation of the IC devices can be enabled.

As mentioned above, the scaling down processes have increased the complexity of processing and manufacturing of ICs. For example, it is found that resistance of copper, which is used to form semiconductor structure including the connecting structures formed by MEOL and BEOL processes, is increased when a thickness of the copper is reduced.

The present disclosure therefore provides a semiconductor structure and a method for forming the same. In some embodiments, two-dimensional (2D) materials are used to form the semiconductor structure, such that the increased-resistance issue of the semiconductor structure can be mitigated while reducing the device size. In some embodiments, the semiconductor structure including the 2D material can be used to form MEOL connecting structures. For example, the semiconductor structure including the 2D material can be a MEOL metallization such as a contact or a plug. In other embodiments, the semiconductor structure including the 2D material can be used to form BEOL connecting structures. In such embodiments, the semiconductor structure including the 2D material can be a BEOL metallization such as lines that are connected to each other by vias.

FIG. 1 is a fragmentary cross-sectional view of a semiconductor structure 100. As mentioned above, an IC manufacturing process flow can typically be divided into the three categories: FEOL, MEOL and BEOL processes. In some embodiments, the devices formed by the FEOL processes can be referred to as FEOL devices 110, the semiconductor structures formed by the MEOL processes can be referred to as MEOL connecting structures 120, and the MLI structures formed by the BEOL processes can be referred to as BEOL connecting structures 130. Accordingly, a semiconductor structure 100 can include the FEOL devices 110, the MEOL connecting structures 120 and the BEOL connecting structures 130.

FIGS. 2 to 5 are schematic drawings respectively illustrating a semiconductor structure according to various aspects of the present disclosure. It should be noted that same elements in FIGS. 2 to 5 are indicated by the same numerals, and can include a same material. In some embodiments, a semiconductor structure 200a can be provided as shown in FIGS. 2 to 5. In some embodiments, the semiconductor structure 200a can be a MEOL connecting structure 120 as shown in FIG. 1, but the disclosure is not limited thereto. As shown in FIGS. 2 to 5, the semiconductor structure 200a may include a substrate (wafer) 202. In some embodiments, the substrate 202 includes silicon. Alternatively or additionally, the substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (Site), GaAsP, AlInAs, AlGaAs, GaInAs, GaInP, and/or GaInAsP; or combinations thereof. In some implementations, the substrate 202 includes one or more group III-V materials, one or more group II-IV materials, or combinations thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 202 can include various doped regions (not shown) configured according to design requirements of a device, such as p-type doped regions, n-type doped regions, or combinations thereof. P-type doped regions (for example, p-type wells) include p-type dopants, such as boron, indium, another p-type dopant, or combinations thereof. N-type doped regions (for example, n-type wells) include n-type dopants, such as phosphorus, arsenic, another n-type dopant, or combinations thereof. In some implementations, the substrate 202 includes doped regions formed with a combination of p-type dopants and n-type dopants. The various doped regions can be formed directly on and/or in the substrate 202, for example, providing a p-well structure, an n-well structure, a dual-well structure, a raised structure, or combinations thereof. An ion implantation process, a diffusion process, and/or another suitable doping process can be performed to form the various doped regions.

Isolations (not shown) can be formed over and/or in the substrate 202 to electrically isolate various regions, such as various device regions, of the semiconductor structure. For example, the isolations can define and electrically isolate active device regions and/or passive device regions from each other. The isolations can include silicon oxide, silicon nitride, silicon oxynitride, another suitable isolation material, or combinations thereof. Isolation features can include different structures, such as shallow trench isolation (STI) structures, deep trench isolation (DTI) structures, and/or local oxidation of silicon (LOCOS) structures.

Various devices can be formed over the substrate 202. For example, a field effect transistor (FET) device including a gate structure, a source structure and a drain structure can be disposed over the substrate 202, though not shown. In some embodiments, the gate structure can be formed over a fin structure. In some embodiments, the gate structure can include a metal gate structure. In some embodiments, the metal gate structure includes a gate dielectric layer and a gate electrode. The gate dielectric layer can be disposed over the substrate 202, and the gate electrode is disposed on the gate dielectric layer. The gate dielectric layer includes a dielectric material, such as silicon oxide, high-k dielectric material, another suitable dielectric material, or combinations thereof. High-k dielectric material generally refers to dielectric materials having a high dielectric constant, for example, a dielectric constant greater than that of silicon oxide ($k \approx 3.9$). Exemplary high-k dielectric materials include hafnium, aluminum, zirconium, lanthanum, tantalum, titanium, yttrium, oxygen, nitrogen, another suitable constituent, or combinations thereof. In some embodiments, the gate dielectric layer includes a multilayer structure, such as an interfacial layer (IL) including, for example, silicon oxide, and a high-k dielectric layer including, for example, $HfO_2$, HfSiO, HfSiON, HMO, HMO, HfZrO, $ZrO_2$, $Al_2O_3$, $HfO_2$—$Al_2O_3$, $TiO_2$, $Ta_2O_5$, $La_2O_3$, $Y_2O_3$, another suitable high-k dielectric material, or combinations thereof.

The gate electrode includes an electrically-conductive material. In some implementations, the gate electrode includes multiple layers, such as one or more work function metal layers and gap-filling metal layers. The work function metal layer includes a conductive material tuned to have a desired work function (such as an n-type work function or a p-type work function), such as n-type work function materials and/or p-type work function materials. P-type work function materials include TiN, TaN, Ru, Mo, WN, $ZrSi_2$, $MoSi_2$, $TaSi_2$, $NiSi_2$, WN, other p-type work function material, and combinations thereof. N-type work function materials include Ti, Al, Ag, Mn, Zr, TiAl, TiAlC, TaC, TaCN, TaSiN, TaAl, TaAlC, TiAlN, other n-type work function materials, and combinations thereof. The gap-filling metal layer can include a suitable conductive material, such as Al, W, and/or Cu.

The gate structure can further include spacers (not shown), which are disposed adjacent to (for example, along sidewalls of) the gate structure. The spacers can be formed by any suitable process and include a dielectric material. The dielectric material can include silicon, oxygen, carbon, nitrogen, another suitable material, or combinations thereof (for example, silicon oxide, silicon nitride, silicon oxynitride, or silicon carbide). In some embodiments, the spacers can include a multilayer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate structure.

Implantation, diffusion, and/or annealing processes can be performed to form lightly-doped source and drain (LDD) features and/or heavily-doped source and drain (HDD) features in the substrate 202 before and/or after the forming of the spacers.

In some embodiments, the source structure and the drain structure of the device can include epitaxial structures (not shown). Accordingly, the gate structure, the epitaxial source/drain structure and a channel region defined between the epitaxial source/drain structures form a device such as a transistor. In some embodiments, the epitaxial source/drain structures can surround source/drain regions of a fin structure. In some embodiments, the epitaxial source/drain structures can replace portions of the fin structure. The epitaxial source/drain structures are doped with n-type dopants and/or p-type dopants. In some embodiments, where the transistor is configured as an n-type device (for example, having an n-channel), the epitaxial source/drain structure can include silicon-containing epitaxial layers or silicon-carbon-containing epitaxial layers doped with phosphorous, another n-type dopant, or combinations thereof (for example, Si:P epitaxial layers or Si:C:P epitaxial layers). In alternative embodiments, where the transistor is configured as a p-type device (for example, having a p-channel), the epitaxial source/drain structures 180 can include silicon-and-germanium-containing epitaxial layers doped with boron, another p-type dopant, or combinations thereof (for example, Si:Ge:B epitaxial layers). In some embodiments, the epitaxial source/drain structures include materials and/or dopants that achieve desired tensile stress and/or compressive stress in the channel region.

Figure 2:
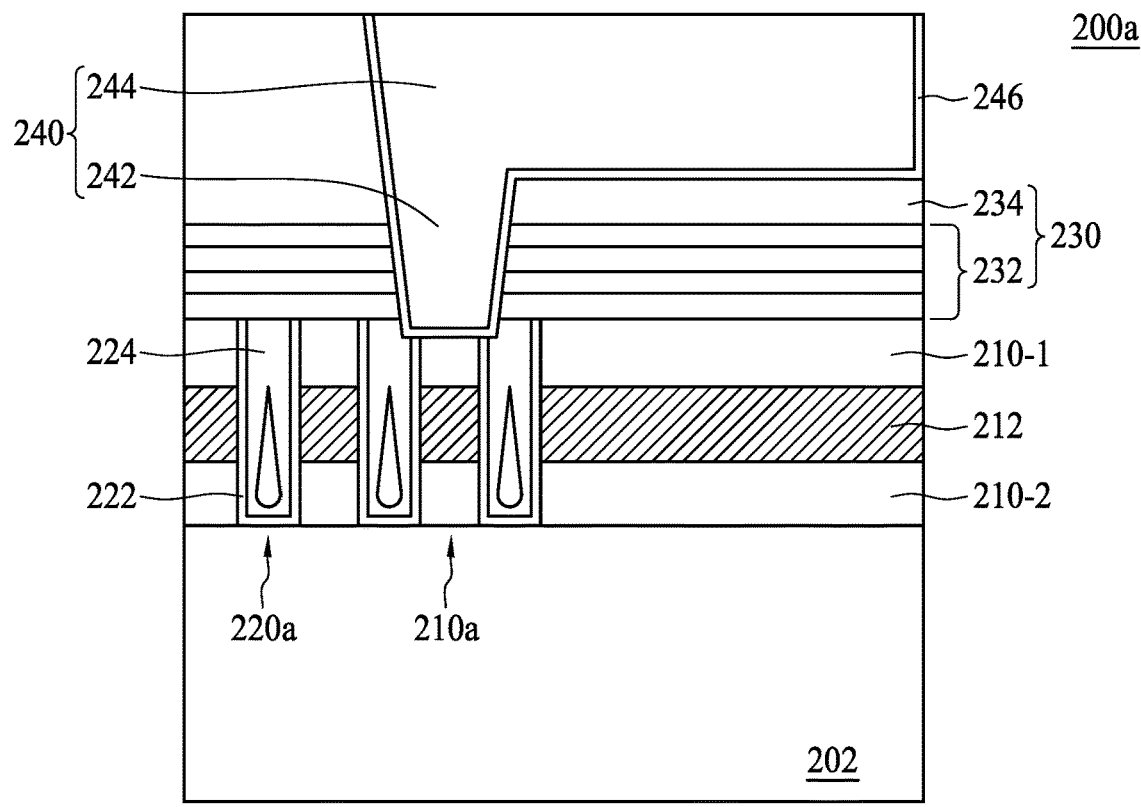
FIGS. 2 to 11 are schematic drawings respectively illustrating a semiconductor structure according to various aspects of the present disclosure.
Figure 4:
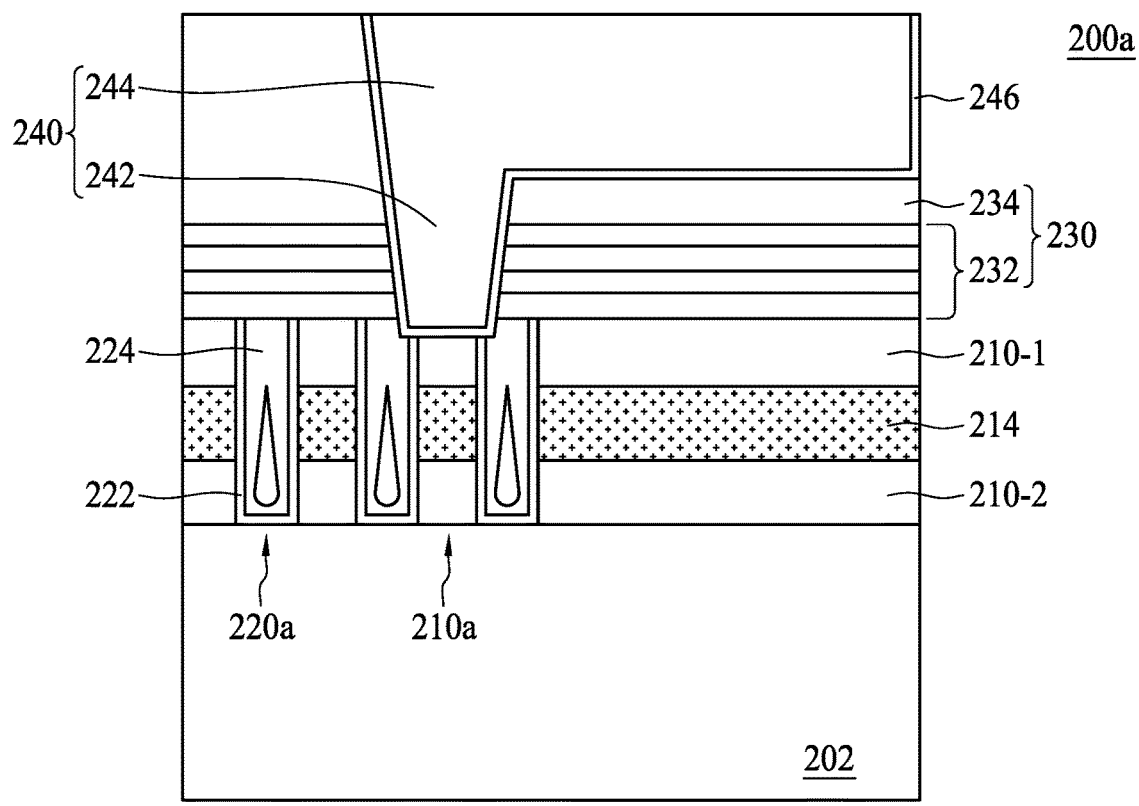

In some embodiments, the semiconductor structure 200a includes a plurality of conductive features 210a disposed over the substrate 202. In some embodiments, the semiconductor structure 200a includes an isolation structure between the conductive features 210a and separating the conductive features 210a from each other. In some embodiments, the isolation structure of the semiconductor structure 200a can include an air gap 220a, as shown in FIGS. 2 and 4. In such embodiments, a liner 222 may serve as a bottom and sidewall of the air gap 220a, and a dielectric structure 224 may serve as a cap of the air gap 220a. Accordingly, the air gap 220a is sealed within the liner 222 and the dielectric structure 224.

The liner 222 and the dielectric structure 224 include different materials. In some embodiments, the liner 222 can include silicon oxide (SiOx), silicon carbide (SiCx), silicon nitride (SiNx), silicon oxynitride (SixOyNz), silicon oxycarbide (SixOyCz), aluminum oxide (AlOx), aluminum nitride (AlN), transition metal carbide, transition metal nitride, transition metal oxide and other related dielectric materials. In some embodiments, the dielectric structure 224 can a dielectric material including, for example, silicon oxide, silicon nitride, silicon oxynitride, silicon carbide, carbon-containing silicon oxide, silicon oxycarbide (SiOxCy), another suitable dielectric material, or combinations thereof. In some embodiments, the dielectric structure 224 can include dielectric material having a dielectric constant between approximately 1 and approximately 5. In some embodiments, the dielectric structure 224 can include a dielectric material having a low-k dielectric constant. Exemplary low-k dielectric materials include FSG, carbon-doped silicon oxide, Black Diamond® (Applied Materials of Santa. Clara, Calif.), Xerogel, Aerogel, amorphous fluorinated carbon, Paryiene, BCB, SILK (Dow Chemical, Midland, Mich.), polyimide, another low-k dielectric material, and combinations thereof.

Figure 3:
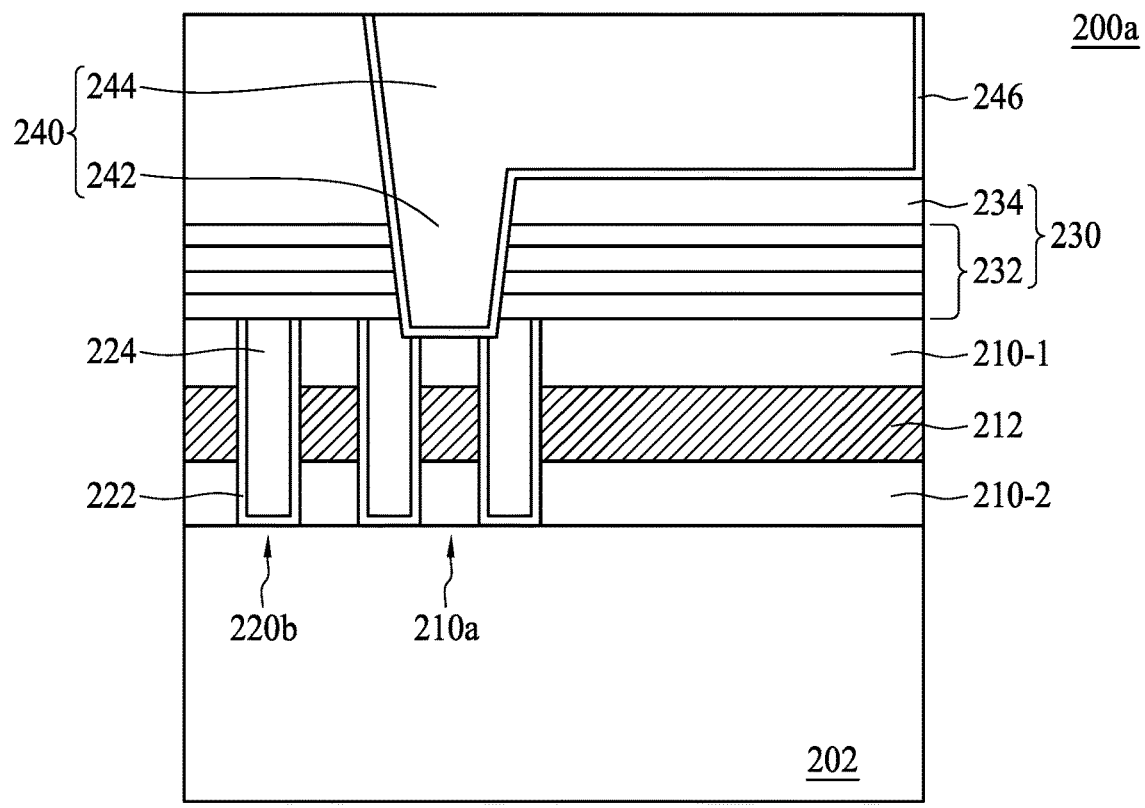
Figure 5:
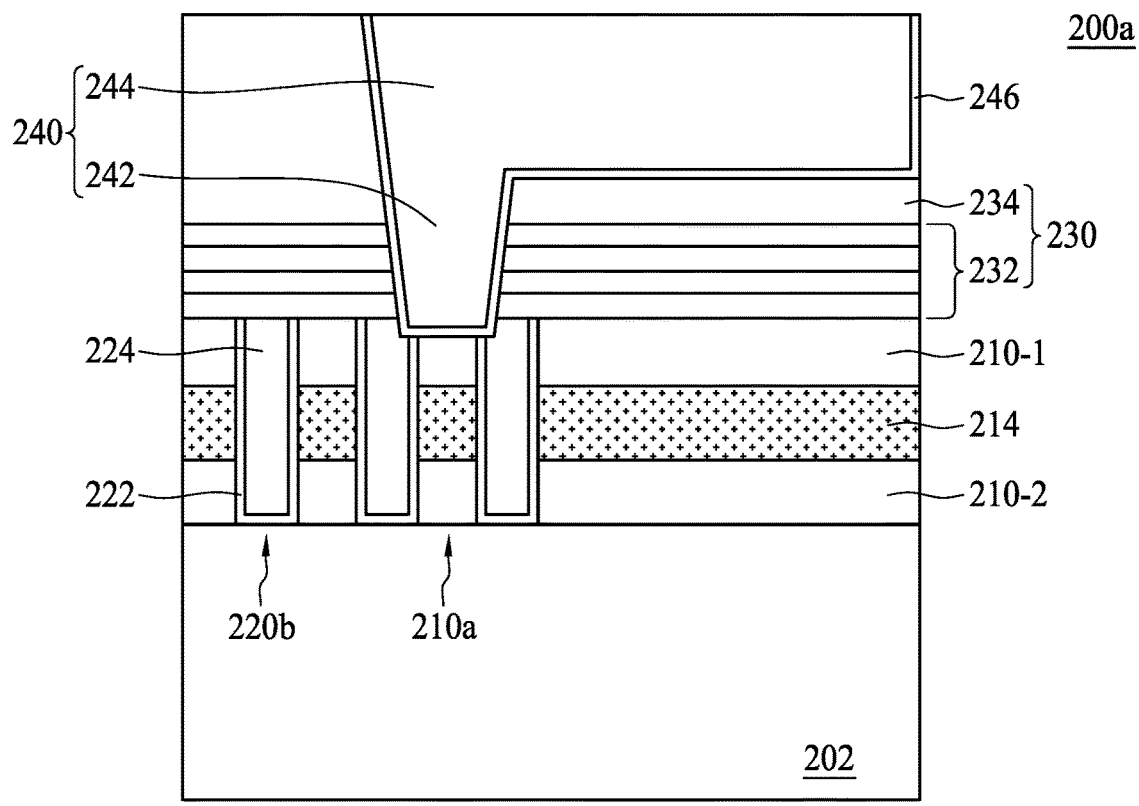

In other embodiments, the isolation structure of the semiconductor structure 200a can include a dielectric structure 220b, as shown in FIGS. 3 and 5. In such embodiments, the dielectric structure 220b can include a liner 222 and a low-k dielectric structure 224. In some embodiments, the liner 222 can include materials the same as those mentioned above, and the low-k dielectric structure 224 can include materials the same as those mentioned above; therefore repeated descriptions of such details are omitted for brevity. As shown in FIGS. 3 and 5, the liner 222 covers sidewalls and bottoms of the low-k dielectric structure 224.

In some embodiments, each of the conductive features 210a includes a 3D material layer 210-1, a 2D material layer 212 (or 214 in FIGS. 4 and 5) and a 3D material layer 210-2. As shown in FIGS. 2 to 5, the 2D material layer 212 or 214 is disposed between the 3D material layer 210-1 and the 3D material layer 210-2. In some embodiments, a thickness of the 2D material layer 212 or 214, a thickness of the 3D material layer 210-1 and a thickness of the 3D material layer 210-2 can be similar, but the disclosure is not limited thereto. In other embodiments, the thickness of the 2D material layer 212 or 214 can be greater than the thickness of the 3D material layer 210-1, and greater than the thickness of the 3D material layer 210-2, but the disclosure is not limited thereto. In some embodiments, the thickness of the 2D material layer 212 or 214 can be between approximately 0.2 nanometers and approximately 1,000 nanometers. In some comparative approaches, when the thickness of the 2D material layer 212 or 214 is less than 0.2 nanometers, electrical conductivity of the 2D material layer 212 or 214 is adversely impacted. In some alternative comparative approaches, when the thickness of the 2D material layer 212 or 214 is greater than 1,000 nanometers, the 2D material layer 212 or 214 can be replaced with 3D metal material because 3D metal material provides greater electrical conductivity and less resistivity.

The 3D material layer 210-1 and the 3D material layer 210-2 can include a same material. In some embodiments, the 3D material layers 210-1 and 210-2 can include metal, such as copper (Cu), silver (Ag), gold (Au), aluminum (Al), nickel (Ni), cobalt (Co), ruthenium (Ru), (Ir), platinum (Pt), palladium (Pd), osmium (Os), tungsten (W), molybdenum (Mo), tantalum (Ta) and related alloys, but the disclosure is not limited thereto.

In some embodiments, the 2D material layer 212 can include graphene, but the disclosure is not limited thereto. As shown in FIGS. 4 and 5, in some embodiments, the 2D material layer 212 can be replaced with another 2D material layer 214. The 2D material layer 214 may include a thickness the same as that of the 2D material layer 212. In some embodiments, the 2D material layer 214 includes graphene and intercalation components. In some embodiments, the intercalation components include metals, metal ionic compounds, organic compounds and halogen molecules. For example, the intercalation components can include metal ionic compounds such as ferric chloride ($FeCl_3$), sodium hydroxide (NaOH), lithium boride (LiB), or the like. In some embodiments, the intercalation components can include organic compounds such as tetracyanoquinodimethane (TNCQ), tetrathiafulvalence (TTF), or the like.

In some embodiments, the semiconductor structure 200a can include a dielectric structure 230 over the conductive features 210a and the isolation structure or 220b. In some embodiments, the dielectric structure 230 can include a single-layered structure. In some embodiments, the dielectric structure 230 can include a multi-layered structure. For example, the dielectric structure 230 can include a liner-oxide-liner-oxide (LOLO) structure 232 and a dielectric material 234, hut the disclosure is not limited thereto.

Still referring to FIGS. 2 and 3, in some embodiments, the semiconductor structure 200a further includes an interconnect structure 240 disposed in the dielectric structure 230. The interconnect structure 240 can be a part of the BEOL connecting structure 130. As shown in FIGS. 2 and 3, the interconnect structure 240 can include a conductive feature such as a via 242 and a conductive line 244. In some embodiments, the via 242 and the conductive line 244 can include a same material. In some embodiments, the via 242 and the conductive line 244 can include a 3D material. In some embodiments, the via 242 and the conductive line 244 can include metal. In some embodiments, the interconnect structure 240 and the 3D material layers 210-1 and 210-2 can include a same metal material. In some embodiments, a barrier layer 246 can be disposed between the interconnect structure 240 and the dielectric structure 230. In some embodiments, the barrier layer 246 can include titanium (Ti), tantalum (Ta), titanium nitride (TiN), tantalum nitride (TaN), and other metal nitrides.

As mentioned above, the conductive features 210a can be referred to as a part of the MEOL connecting structure 120 coupled to a conductive region of a transistor, such as the source/drain regions S/D, while the interconnect structure 240 can be a part of the BEOL connecting structure 130. Accordingly, the device over the substrate 202 can be connected to the interconnect structure 240 through the conductive features 210a. In other words, the FEOL devices 110 can be electrically connected to the BEOL connecting structure 120 through the MEOL connecting structures 130.

According to the semiconductor structure 200a shown in FIGS. 2 to 5, the 2D material layer 212 or 214 is provided between the 3D material layers 210-1 and 210-2. When the thickness of the 2D material layer 212 or 214 is between approximately 0.2 nanometer and 1,000 nanometers, the resistance of the conductive feature 210 is less than a resistance of a conductive feature including a pure 3D material layer. Further, the 3D material layers 210-1 and 210-2 can provide sufficient mechanical strength to support the 2D material layer 212 or 214, and to support the air gap 220a. The 3D material layers 210-1 and 210-2 further provides areas for via landing. Therefore, the semiconductor structure 200a helps improve the scaling down of the IC.

FIGS. 6 to 9 are schematic drawings respectively illustrating a semiconductor structure according to various aspects of the present disclosure. It should be noted that same elements in FIGS. 2 to 9 are indicated by the same numerals, and repeated descriptions of those elements can be omitted for brevity. In some embodiments, a semiconductor structure 200b can be provided as shown in FIGS. 6 to 9. In some embodiments, the semiconductor structure 200h can be a MEOL connecting structure 120 as shown in FIG. 1, but the disclosure is not limited thereto. As shown in FIGS. 6 to 9, the semiconductor structure 200b may include a substrate (water) 202. The substrate 202 can include various doped regions (not shown) configured according to design requirements of a device. Isolations (not shown) can be formed over and/or in the substrate 202 to electrically isolate various regions of the semiconductor structure. Various devices can be formed over the substrate 202. For example, a field-effect transistor WEI) device including a gate structure, a source structure and a drain structure can be disposed over the substrate 202, though not shown.

Figure 6:
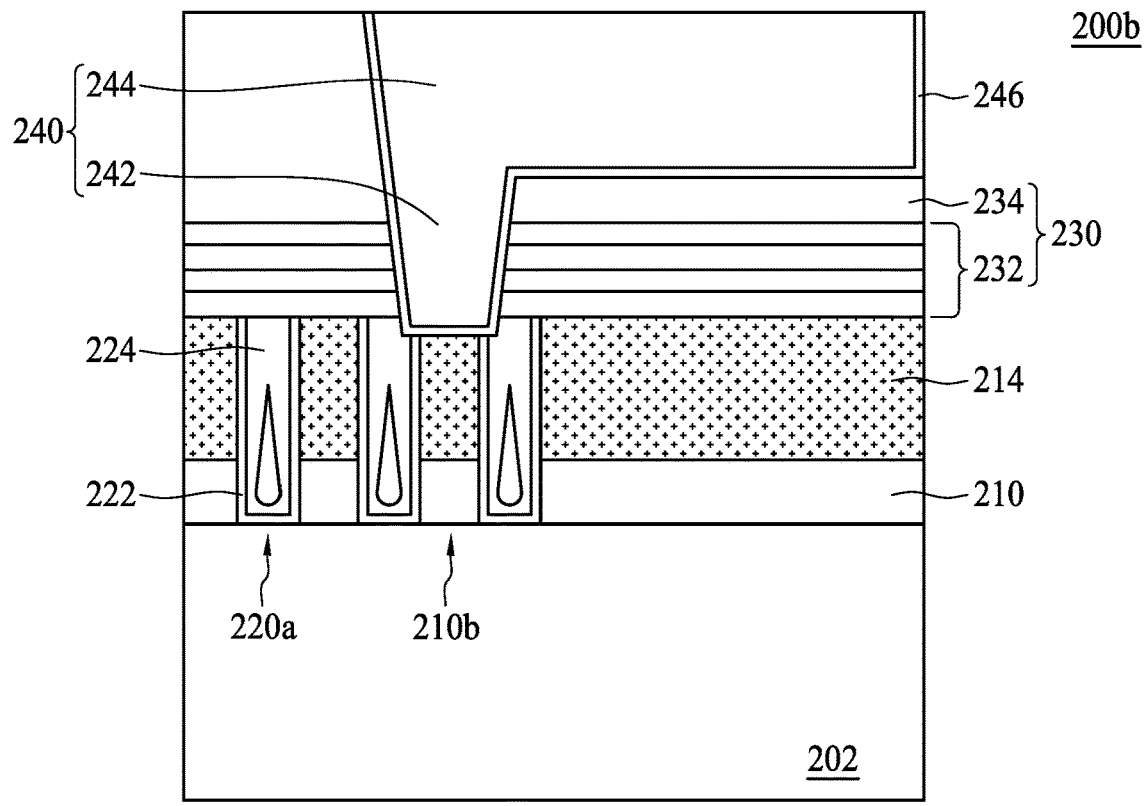
Figure 8:
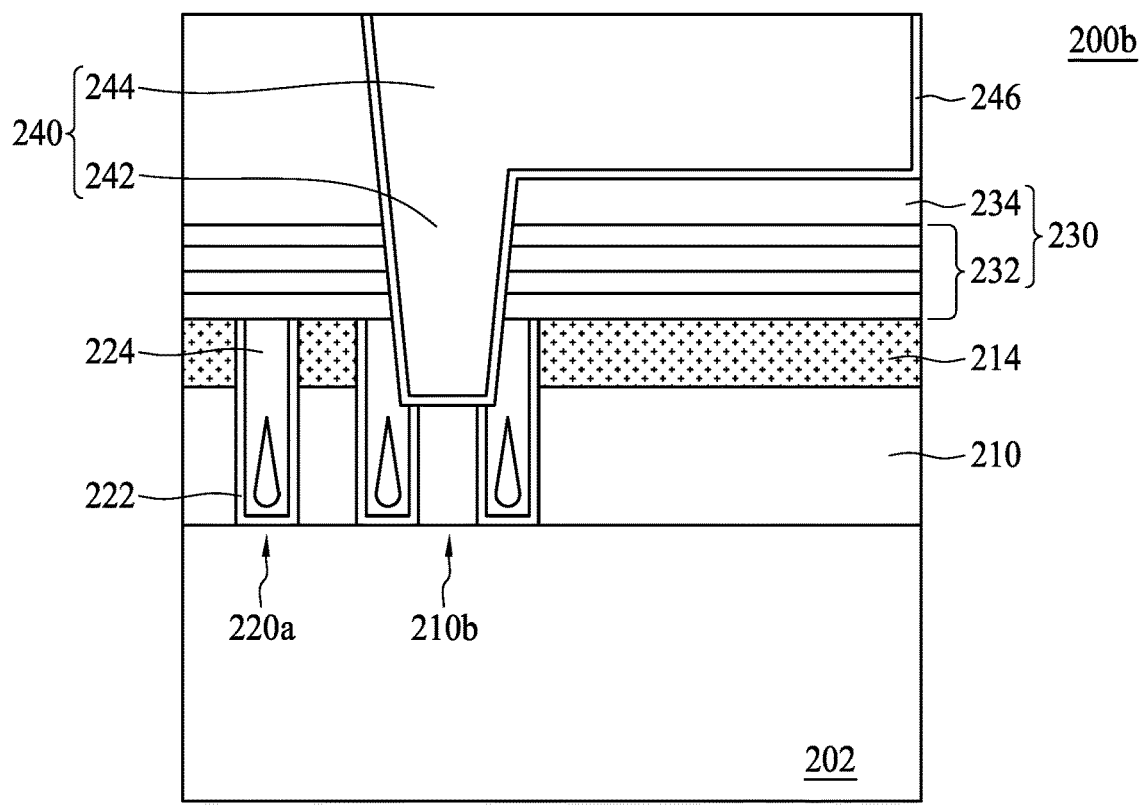

In some embodiments, the semiconductor structure 200b includes a plurality of conductive features 210b disposed over the substrate 202. In some embodiments, the semiconductor structure 200b includes an isolation structure between the conductive features 210b and separating the conductive features 210b from each other. In some embodiments, the isolation structure of the semiconductor structure 200b can include an air gap 220a, as shown in FIGS. 6 and 8. In such embodiments, a liner 222 may serve as a bottom and sidewall of the air gap 220a, and a dielectric structure 224 may serve as a cap of the air gap 220a.

Figure 7:
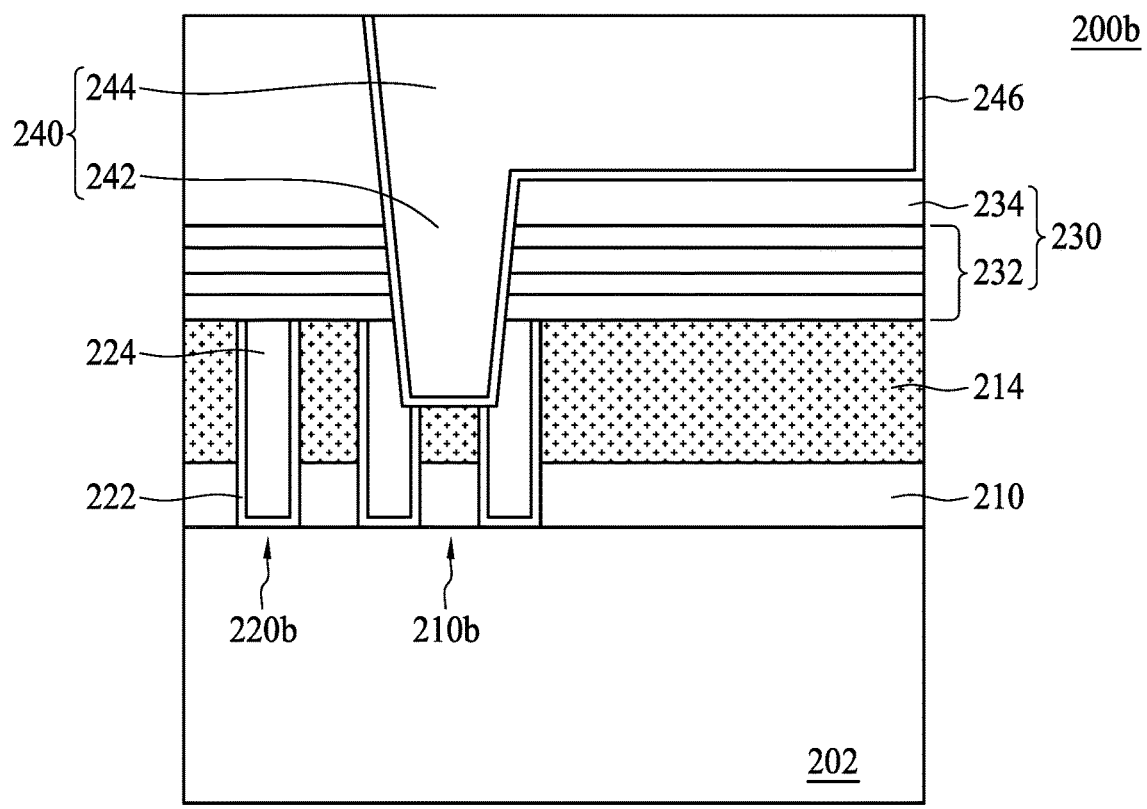
Figure 9:
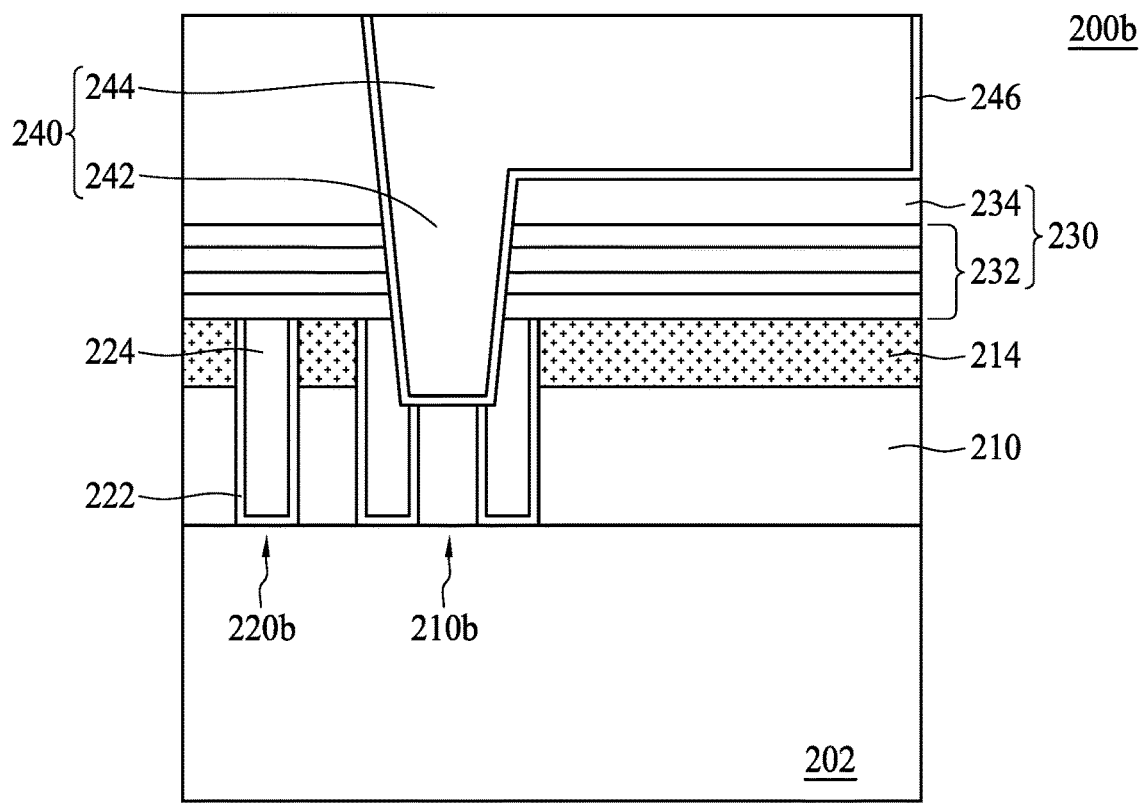

In other embodiments, the isolation structure of the semiconductor structure 200b can include a dielectric structure 220b, as shown in FIGS. 7 and 9. In such embodiments, the dielectric structure 220b can include a liner 222 and a low-k dielectric structure 224. As shown in FIGS. 7 and 9, the liner 222 covers sidewalls and bottoms of the low-k dielectric structure 224.

In some embodiments, each of the conductive features 210b includes a 3D material layer 210 and a 2D material layer 214. Further, the 2D material layer 214 is disposed over the 3D material layer 210. In other words, the 3D material layer 210 is disposed between the 2D material layer 214 and the substrate 202. As shown in FIGS. 6 to 9, the 2D material layer 214 is disposed over the 3D material layer 210. In some embodiments, a thickness of the 2D material layer 214 is greater than a thickness of the 3D material layer 210, as shown in FIGS. 6 and 7, but the disclosure is not limited thereto. The 3D material layer 210 can include materials as mentioned above; therefore, repeated descriptions of such details are omitted. In some embodiments, the 2D material layer 214 can be a 2D material layer including graphene and intercalation components as depicted in FIGS. 6 to 9. In other embodiments, the 2D material layer 214 can be replaced with a 2D material layer 212 including graphene as depicted in FIGS. 2 and 3.

In some embodiments, the semiconductor structure 200b can include a dielectric structure 230 over the conductive features 210b and the isolation structure 220a or 220b. Further, the semiconductor structure 200b includes an interconnect structure 240 disposed in the dielectric structure 230. The interconnect structure 240 can be a part of the BEM connecting structure 130. The interconnect structure 240 can include a conductive feature such as a via 242 and a conductive line 244. In some embodiments, the via 242 is in contact with the 2D material layer 214, as shown in FIGS. 6 and 7.

In some embodiments, as shown in FIGS. 8 and 9, the via 242 is formed to contact the 3D material layer 210. In such embodiments, contact resistance between the via 242 and the 3D material layer 210 can be further reduced when the via 242 and the 3D material layer 210 include a same material. Additionally, in some embodiments, as shown in FIG. 8, the dielectric structure 224 sealing the air gap 220a is thick enough to support the via 242.

According to the semiconductor structure 200b shown in FIGS. 6 to 9, the 2D material layer 214 is provided over the 3D material layer 210. When the thickness of the 2D material layer 214 is between approximately 0.2 nanometer and 1,000 nanometers, the resistance of the conductive feature 210b is less than a resistance of a conductive feature including a pure 3D material layer. Therefore, the semiconductor structure 200b helps improve the scaling down of the IC.

Figure 10:
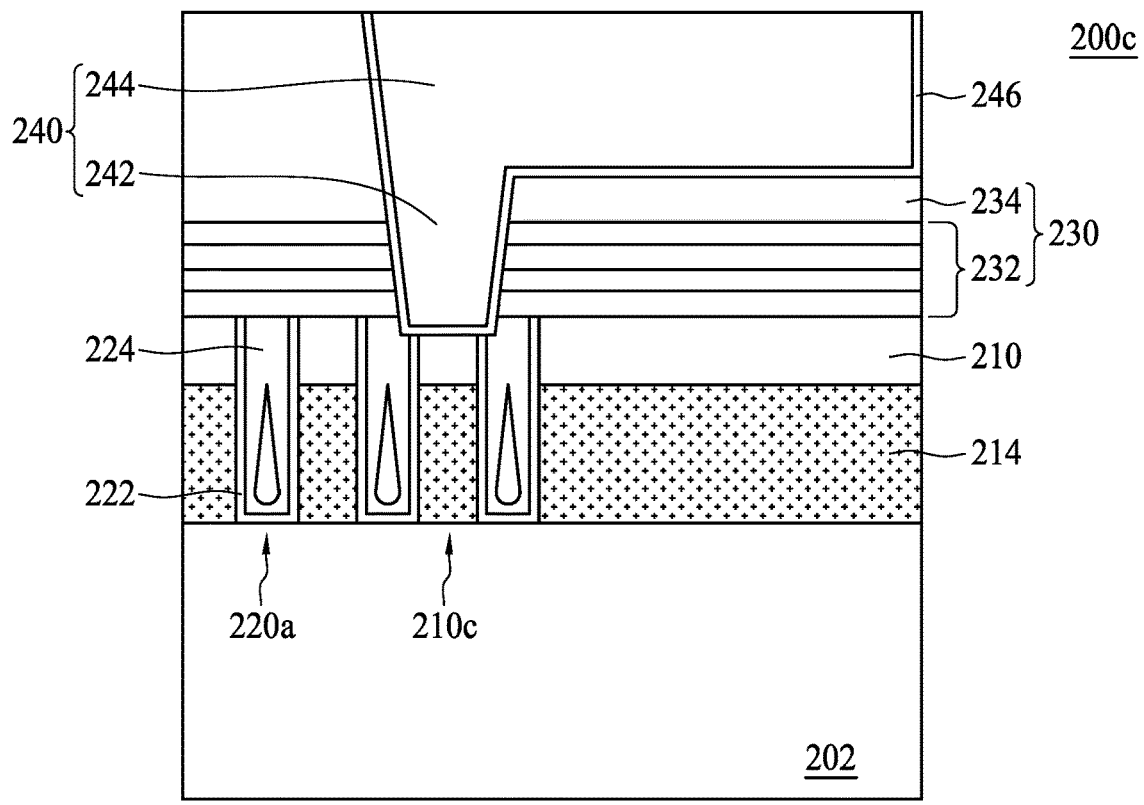
Figure 11:
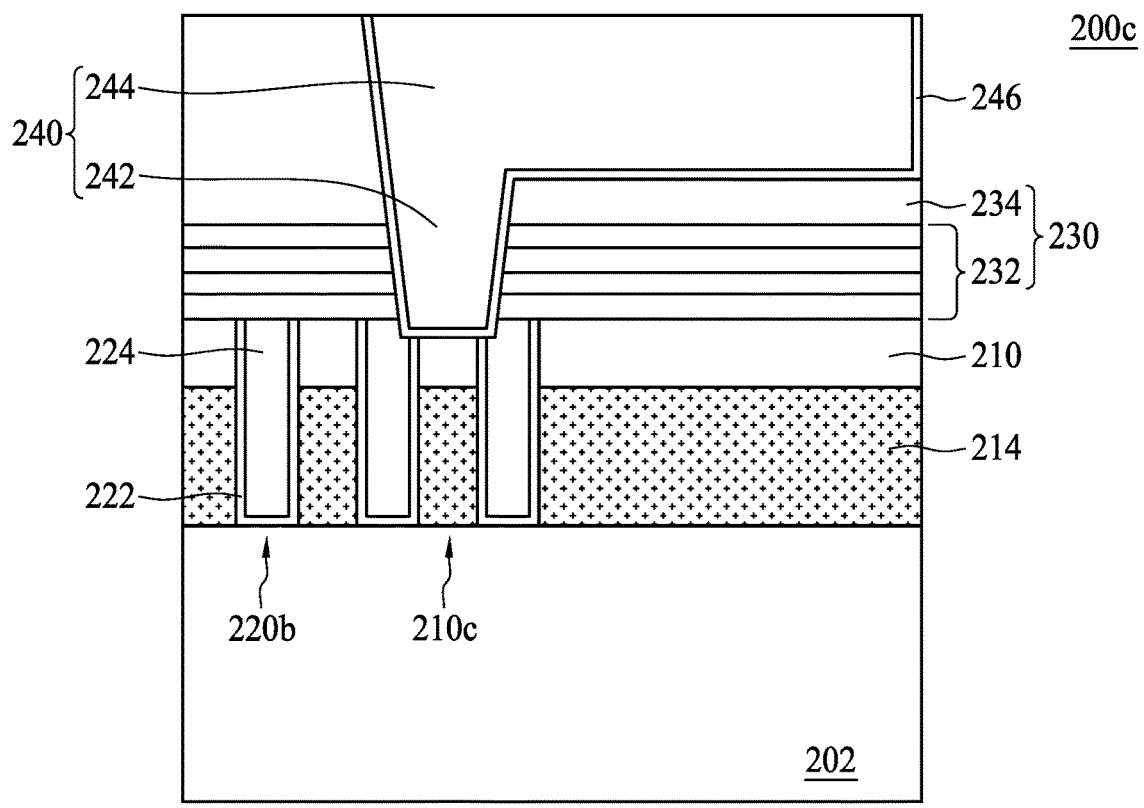

Please refer to FIGS. 10 and 11, which are schematic drawings respectively illustrating a semiconductor structure according to various aspects of the present disclosure. It should be noted that same elements in FIGS. 2 to 11 are indicated by the same numerals, and repeated descriptions of such elements can be omitted for brevity. In some embodiments, a semiconductor structure 200c can be provided as shown in FIGS. 10 and 11. In some embodiments, the semiconductor structure 200c can be a MEOL connecting structure 120 as shown in FIG. 1, but the disclosure is not limited thereto. As shown in FIGS. 10 and 11, the semiconductor structure 200c may include a substrate (wafer) 202. Various devices can be formed over the substrate 202. For example, a FET device including a gate structure, a source structure and a drain structure can be disposed over the substrate 202, though not shown.

In some embodiments, the semiconductor structure 200c includes a plurality of conductive features 210c disposed over the substrate 202. In some embodiments, the semiconductor structure 200c includes an isolation structure between the conductive features 210c and separating the conductive features 210c from each other. In some embodiments, the isolation structure of the semiconductor structure 200c can include an air gap 220a, as shown in FIG. 10. In other embodiments, the isolation structure of the semiconductor structure 200c can include a dielectric structure 220b, as shown in FIG. 11.

In some embodiments, each of the conductive features 210c includes a 3D material layer 210 and a 2D material layer 214. As shown in FIGS. 10 and 11, the 3D material layer 210 is disposed over the 2D material layer 214. In some embodiments, a thickness of the 2D material layer 214 is greater than a thickness of the 3D material layer 210, as shown in FIGS. 10 and 11, but the disclosure is not limited thereto. The 3D material layer 210 can include materials as mentioned above; therefore, repeated descriptions of such details are omitted. In some embodiments, the 2D material layer 214 can be a 2D material layer including graphene and intercalation components as depicted in FIGS. 10 and 11. In other embodiments, the 2D material layer 214 can be replaced with a 2D material layer 212 including graphene as depicted in FIGS. 2 and 3.

In some embodiments, the semiconductor structure 200c can include a dielectric structure 230 over the conductive features 210c and the isolation structure 220a or 220b. Further, the semiconductor structure 200c includes an interconnect structure 240 disposed in the dielectric structure 230. The interconnect structure 240 can be a part of the BEM connecting structure 130. The interconnect structure 240 can include a conductive feature such as a via 242 and a conductive line 244. In some embodiments, the via 242 is in contact with the 3D material layer 210, as shown in FIGS. 10 and 11. In such embodiments, contact resistance between the via 242 and the 3D material layer 210 can be further reduced when the via 242 and the 3D material layer 210 include a same material.

According to the semiconductor structure 200c shown in FIGS. 10 and 11, the 2D material layer 214 is provided under the 3D material layer 210. When the thickness of the 2D material layer 214 is between approximately 0.2 nanometer and 1,000 nanometers, the resistance of the conductive feature 210c is less than a resistance of a conductive feature including a pure 3D material layer. Therefore, the semiconductor structure 200c helps improve the scaling down of the IC.

Figure 12:
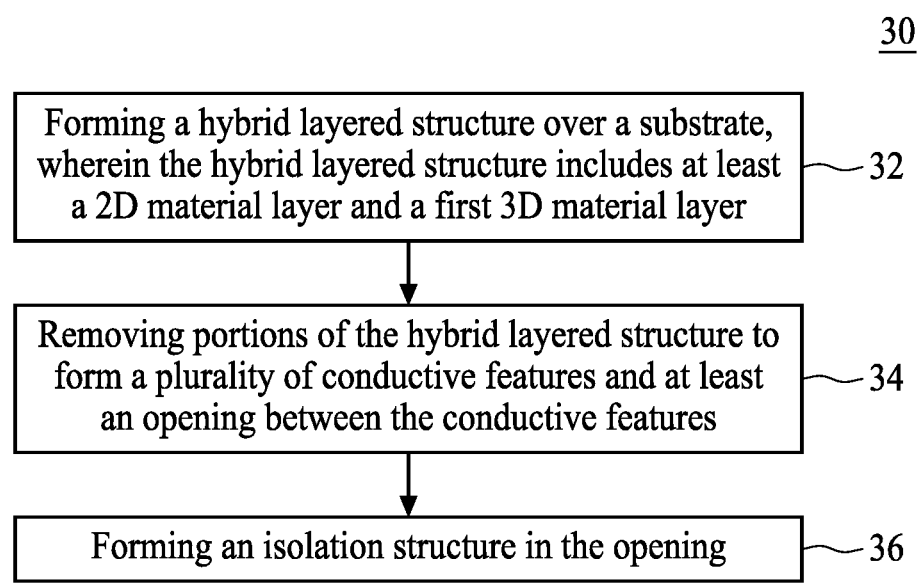
FIG. 12 is a flowchart of a method for forming a semiconductor structure according to various aspects of the present disclosure.

FIG. 12 is a flowchart representing a method for forming a semiconductor structure 30 according to aspects of the present disclosure. In some embodiments, the method for forming the semiconductor structure 30 can be used in a method for forming a semiconductor structure including a MEOL connecting structure mentioned above. In some embodiments, the method for forming the semiconductor structure 30 includes a number of operations (32, 34 and 36). The method for forming the semiconductor structure 30 will be further described according to one or more embodiments. It should be noted that the operations of the method 30 may be rearranged or otherwise modified within the scope of the various aspects. It should further be noted that additional processes may be provided before, during, and after the method 30, and that some other processes may be only briefly described herein.

FIGS. 13A to 13H are schematic drawings illustrating various stages in the method for forming the semiconductor structure 30 according to aspects of one or more embodiments of the present disclosure. In some embodiments, a substrate 202 is received. The substrate can be the substrate 102 shown in FIG. 1, but the disclosure is not limited thereto. In some embodiments, the substrate 202 can include a semiconductor device, such as the transistor, though not shown.

Figure 13A:
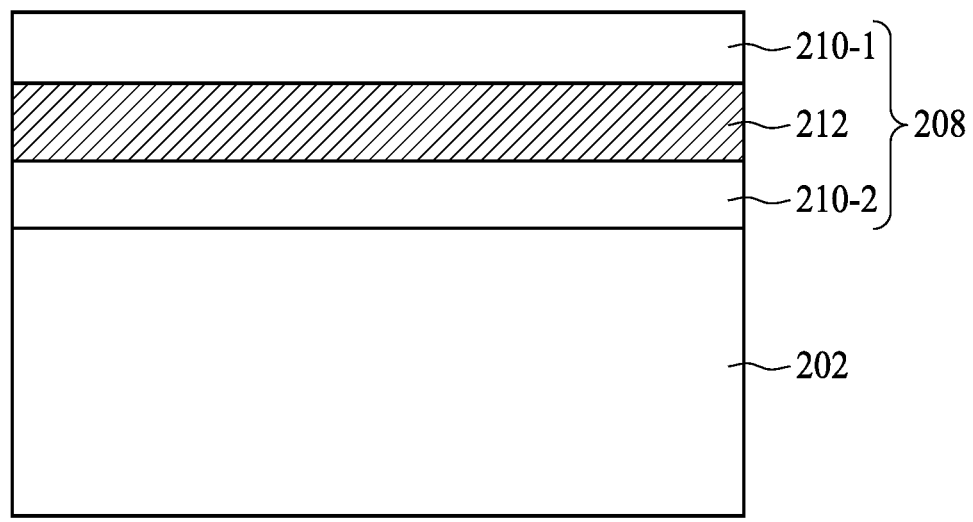
FIGS. 13A to 13H are schematic drawings illustrating various stages in a method for forming a semiconductor structure according to aspects of one or more embodiments of the present disclosure.

Still referring to FIG. 13A, in operation 32, a hybrid layered structure 208 is formed over the substrate 202. In some embodiments, the hybrid layered structure 208 includes a 3D material layer 210-1, a 3D material layer 210-2 and a 2D material layer 212 between the 3D material layers 210-1 and 210-2. However, it should be noted that the hybrid layered structure 208 can include different layer arrangements. For example, in some embodiments, the hybrid layered structure 208 can include one 2D material layer 212 and one 3D material layer 210 stacked on the 2D material layer 212. In other embodiments, the hybrid layered structure 208 can include one 3D material layer 210 and one 2D material layer 212 stacked on the 3D material layer 210. In other embodiments, the hybrid layered structure 208 can include a 2D material layer 212, a 3D material layer 210, a 2D material layer 212 and a 3D material layer 210 stacked to form a 2D-3D-2D-3D hybrid layered structure. In other embodiments, the hybrid layered structure 208 can include a 3D-2D-3D-2D-3D hybrid layered structure. It should be noted that although only the 3D-2D-3D hybrid layered structure 208 is shown in FIG. 13A, other layer arrangements as mentioned above can be adopted according to different product requirements, though not shown. The materials used to form the 2D material layer 212 and the 3D material layers 210-1, 210-2 can be similar to those described above; therefore, repeated descriptions of such details are omitted for brevity. In some embodiments, a thickness of the 2D material layer 212 can be similar to those described above; therefore, repeated description of such details is also omitted for brevity.

In some embodiments, the 2D material layer 212 can be formed by deposition. In such embodiments, the deposition can include atomic layer deposition (ALD), chemical vapor deposition (CVD), plasma-enhanced atomic layer deposition (PEALD), plasma-enhanced chemical vapor deposition (PECVD), or another suitable deposition. In some embodiments, the deposition can be performed at a temperature between approximately 200° C. and approximately 800° C., but the disclosure is not limited thereto. In some embodiments, the 2D material layer 212 can be formed by transferring. In such embodiments, the 2D material layer 212 can be transferred by thermal release tape, bubbling, TMMA stamping, scotch tape, and other suitable methods. In some embodiments, the 2D material layer 212 can be transferred at a temperature between approximately 200° C. and approximately 1,200° C., but the disclosure is not limited thereto.

Figure 13B:
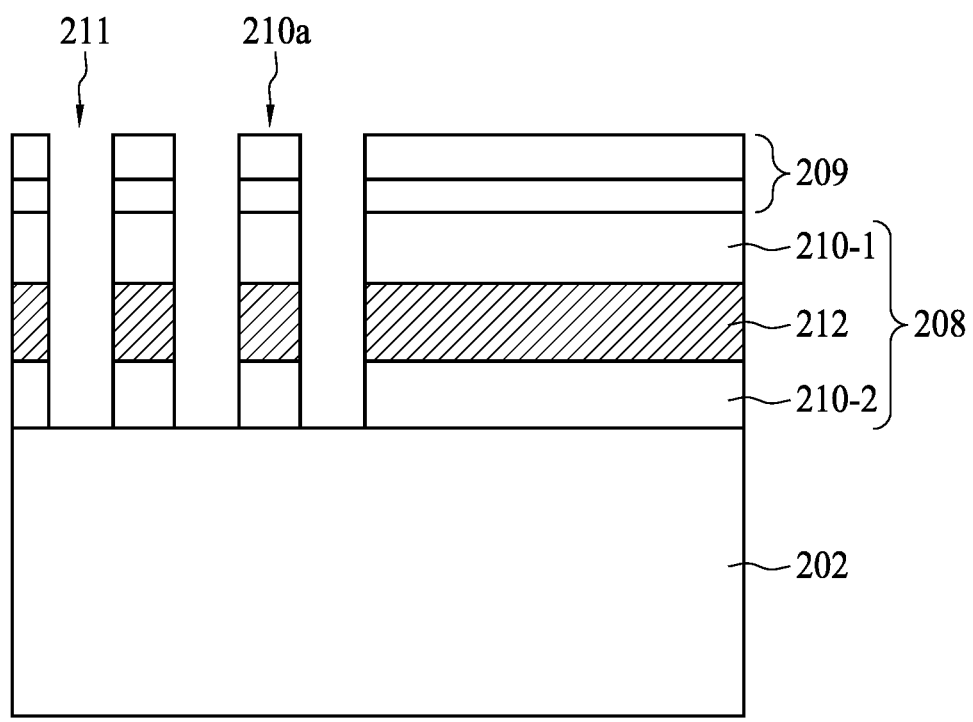

Referring to FIG. 13B, in operation 34, portions of the hybrid layered structure 208 are removed such that a plurality of conductive features 210a are formed. Further, openings 211 are formed between the conductive features 210a. In some embodiments, a patterned hard mask 209 can be formed over the hybrid layered structure 208, and an etching is performed to etch the hybrid layered structure 208 through the patterned hard mask 209. Consequently, the conductive features 210a standing over the substrate 202 and the openings 211 exposing portions of the substrate 202 are formed. In some embodiments, a width W of the conductive features 210a can be between approximately 5 nanometers and approximately 1,000 nanometers, depending on different product requirements. In some embodiments, a width of the openings 211 can be similar to the width W of the conductive features, but the disclosure is not limited thereto.

Figure 13C:
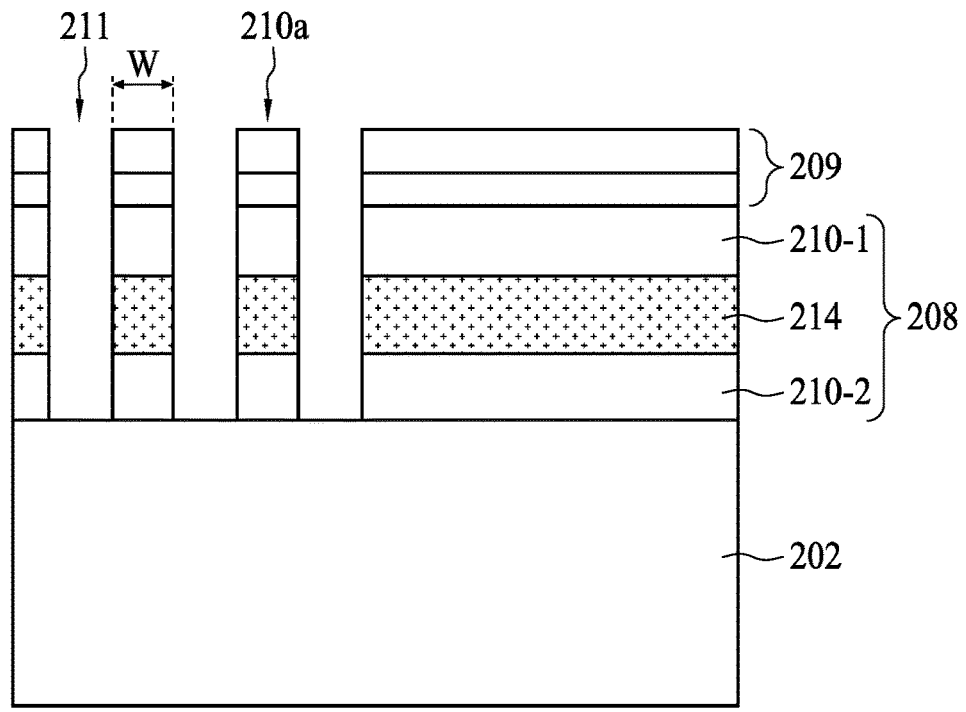

Referring to FIG. 13C, in some embodiments, an intercalation operation can be performed after the forming of the conductive features 210a. In some embodiments, the intercalation operation can include CVD, electrochemical process and other suitable methods. In some embodiments, the intercalation operation can be performed at a temperature between approximately 25° C. and approximately 800° C., but the disclosure is not limited thereto. The intercalation operation is performed such that the 2D material layer can include intercalation components. In other words, the 2D material layer 212 can be transferred to the 2D material layer 214, as shown in FIG. 13C. The intercalation components can be similar to those described above; therefore, repeated descriptions of such details are omitted for brevity.

Figure 13D:
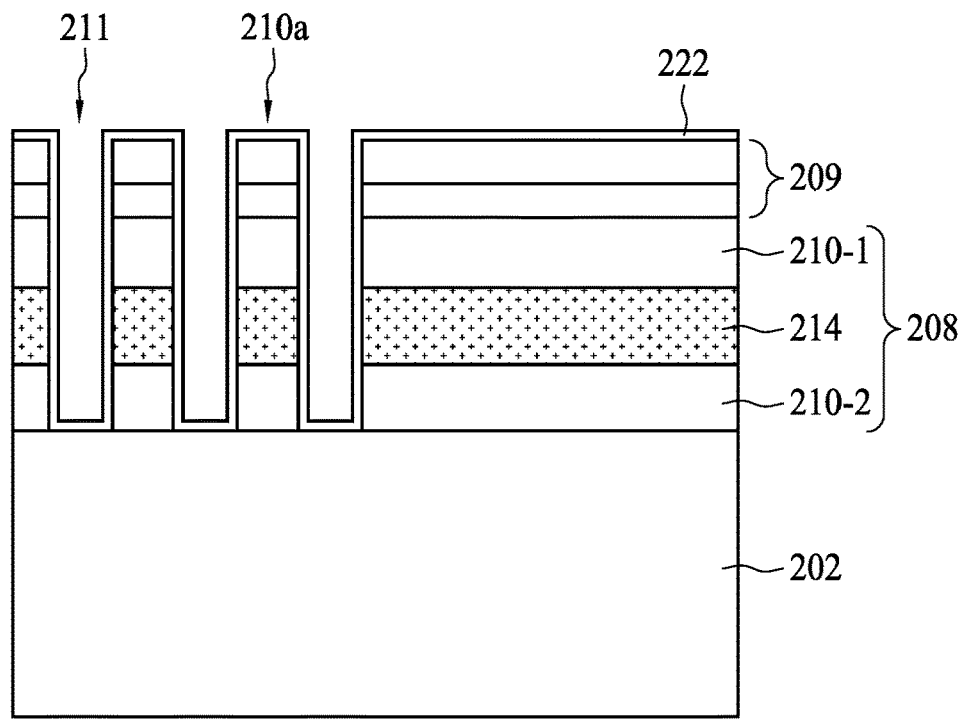

In operation 36, an isolation structure is formed. Referring to FIG. 13D, in some embodiments, the forming of the isolation structure includes forming a liner 222 to cover sidewalls and top surfaces of the conductive features 210a. In addition, the liner 222 covers sidewalls and bottoms of the openings 211, as shown in FIG. 13. It should be noted that in some embodiments, the liner 222 can be formed after the intercalation operation. In other embodiments, the intercalation operation can be omitted and thus the liner 222 can be formed directly after the forming of the conductive features 210a. Materials used to form the liner 222 can be similar to those described above; therefore, repeated descriptions of such details are omitted for brevity.

Figure 13E:
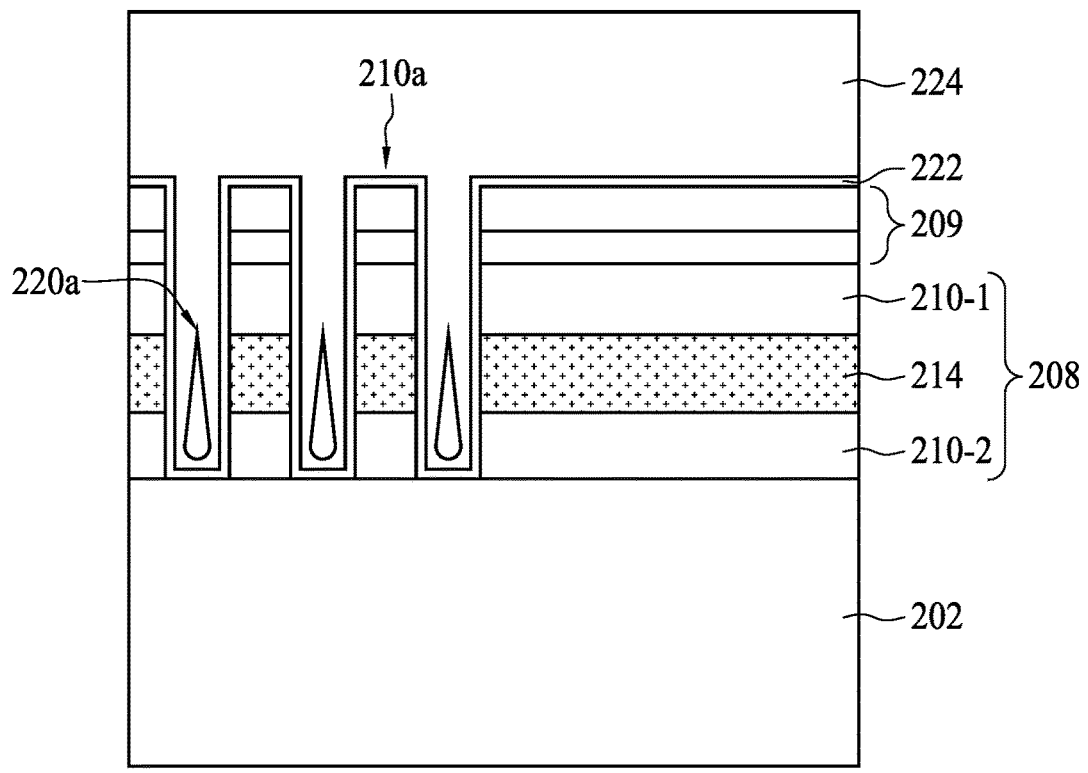
Figure 13F:
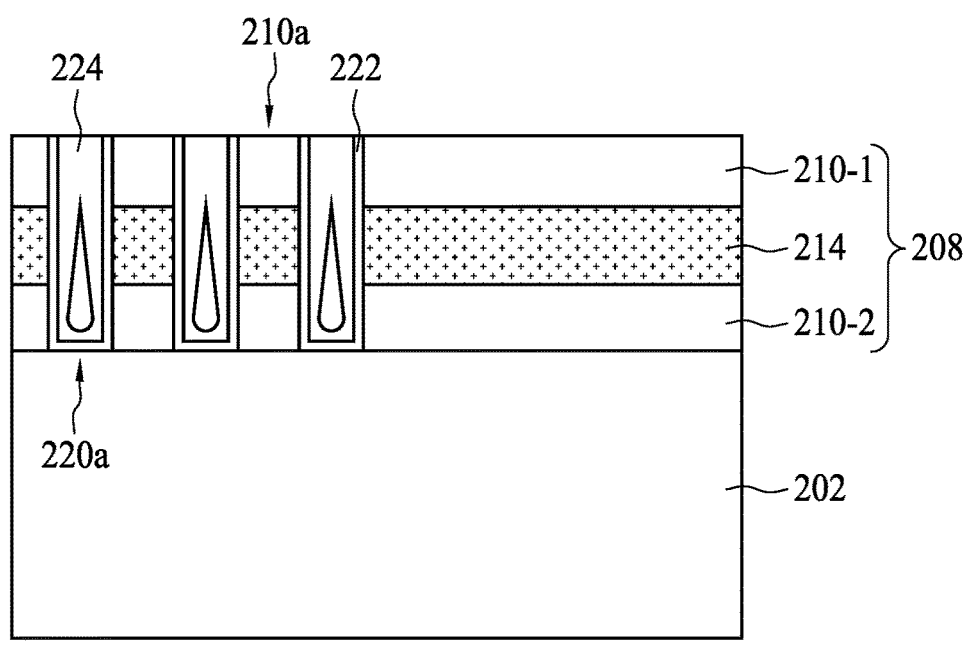

Referring to FIGS. 13E and 13F, the forming of the isolation structure further includes forming a dielectric structure 224 over the liner 222. Materials used to form the dielectric structure 224 can be similar to those described above; therefore, repeated descriptions of such details are omitted for brevity. In some embodiments, the dielectric structure 224 may be formed over the liner 222 covering the bottom and sidewalls of the opening. Further, the openings 211 can be sealed by the dielectric structure 224. In some embodiments, superfluous portions of the dielectric structure 224, the liner 222 and the patterned hard mask 209 can be removed by a planarization operation, such as a chemical mechanical polishing (CMP) operation. Consequently, an air gap 220a is formed within each opening 211. Further, the air gap 220a (can the dielectric structure 224) serves as the isolation structure.

In some embodiments, the forming of the isolation structure includes filling the openings 211 with the dielectric structure 224, and removing a superfluous portion of the dielectric structure. Thus, a plurality of dielectric structures 220b including the dielectric structure 224 and the liner 222 are obtained, as shown in FIGS. 3, 5, 7, 9 and 11.

Figure 13G:
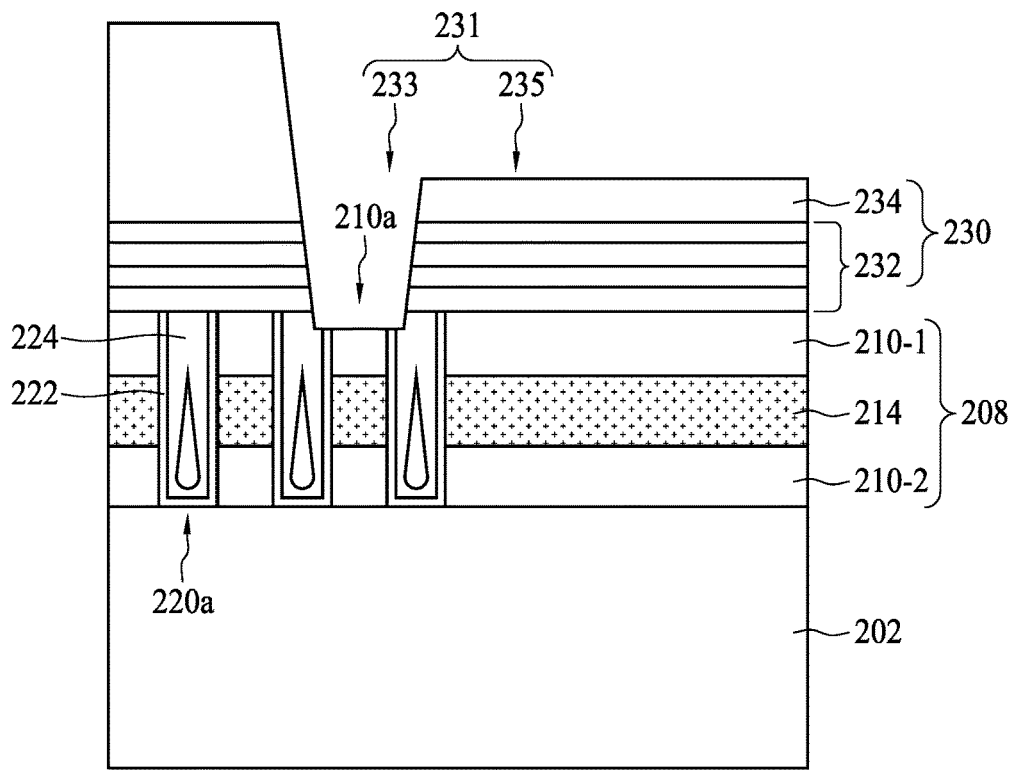

Referring to FIG. 13G, in some embodiments, a dielectric structure 230 can be formed over the substrate 202. As mentioned above the dielectric structure 230 can include a multi-layered structure. For example, the dielectric structure 230 can include a LOLO structure 232 and a dielectric material 234, but the disclosure is not limited thereto. Materials used to form the LOLO structure 232 and the dielectric material 234 can be similar to those described above; therefore, repeated descriptions of such details are omitted for brevity.

Still referring to FIG. 13G, in some embodiments, a plurality of openings 231 can be formed in the dielectric structure 230. In some embodiments, the opening 231 can include a via opening 233 and a trench 235, As shown in FIG. 13G, the via opening 233 and the trench 235 are coupled to each other. In some embodiments, a width of the via opening 233 is greater than a width of the conductive features 210a. Further, at least one of the conductive features 210a is exposed through a bottom of the via opening 233. The openings 231 (including the via opening 233 and the trench 235) can be formed by any suitable operation such as dual damascene formation operations, and descriptions of such details are omitted for brevity. It should be noted that when the conductive features are formed to have one 2D material layer 214 over one 3D material layer 210 as shown in FIGS. 6 to 9, a depth of the via opening 233 can be increased to expose the 3D material layer 210, which is under the 2D material layer 214.

Figure 13H:
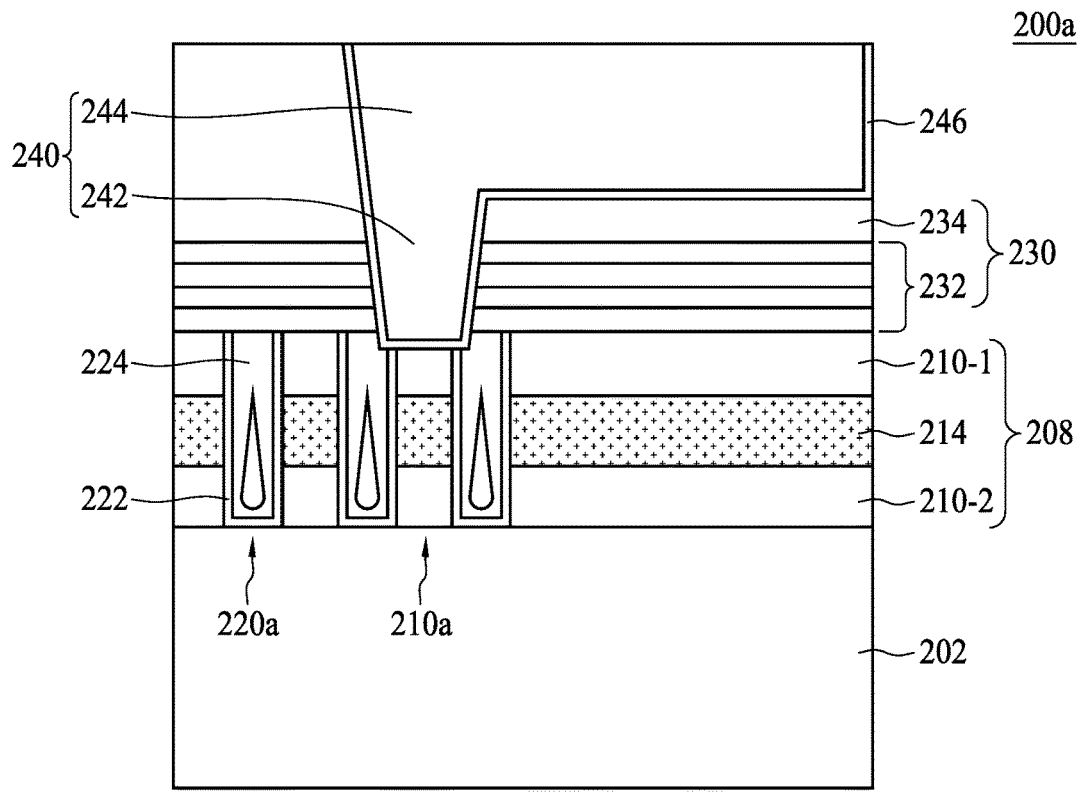

Referring to FIG. 13H, a barrier layer 246 can be formed to cover bottoms and sidewalls of the openings 231. Subsequently, the openings 231 are filled with a conductive material. A planarization such as a CMP operation can be performed to remove superfluous portions of the conductive material and the barrier layer. Consequently, an interconnect structure 240 including a via 242 and a conductive line 244 can be obtained.

In such embodiments, the semiconductor structure 200a is obtained. It should be noted that, by selecting different 2D material and 3D material, and arranging the operations for forming the 2D material layer and the 3D material layer, the semiconductor structure 200b including the conductive features 210b or the semiconductor structure 200c including the conductive features 210c can be formed according to different product requirements. In other words, the embodiments for forming the semiconductor structure provide flexibility for integrating the 2D material in the MEOL process.

Figure 14:
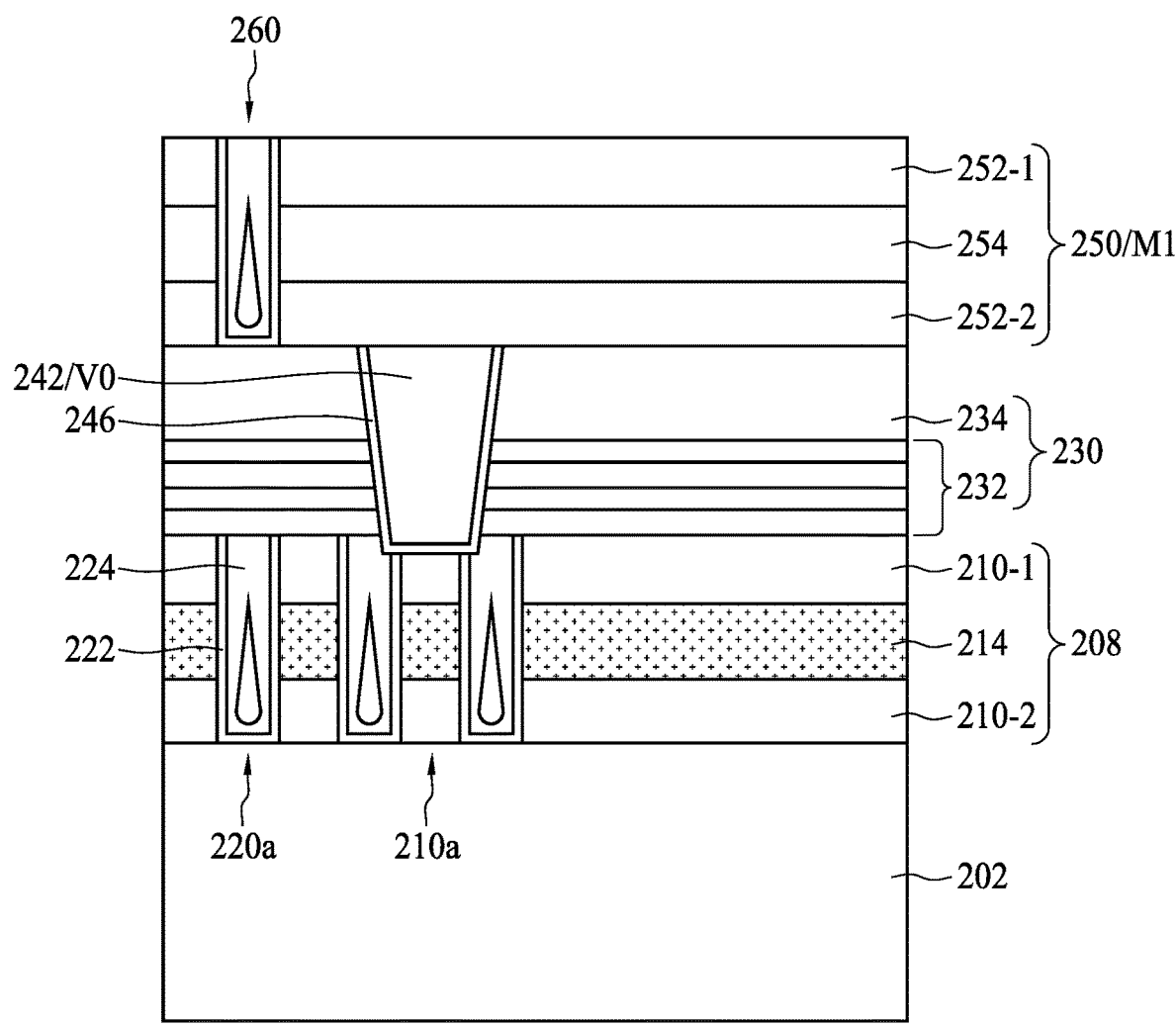
FIG. 14 is a schematic drawing respectively illustrating a semiconductor structure according to various aspects of the present disclosure.

FIG. 14 is a schematic drawing illustrating a semiconductor structure 200d provided according to various aspects of the present disclosure. It should be noted that same elements in FIGS. 2 to 14 are indicated by the same numerals, and repeated descriptions of such elements can be omitted for brevity. In some embodiments, the semiconductor structure 200d is provided and includes both a MEOL connecting structure 120 and a BEOL connecting structure 130. In some embodiments, the semiconductor structure 200d includes the BEOL connecting structure 130. In such embodiments, the BEOL connecting structure 130 can be an Mn+1 conductive line. In some embodiments, the BEOL connecting structure 130 includes a plurality of conductive lines referred to as M1 to Mn+1 and a plurality of vias referred to as V0 to Vn. Further, the conductive lines Mn to Mn+1 are coupled to each other by the via Vn. For example, the semiconductor structure 200d can include the M1 conductive line coupled to the MEOL connecting structure by the via V0, as shown in FIG. 14, but the disclosure is not limited thereto.

In some embodiments, the semiconductor structure 200d includes a substrate (wafer) 202. The substrate 202 can include various doped regions (not shown) configured according to design requirements of devices. Isolations (not shown) can be formed over and/or in the substrate 202 to electrically isolate various regions. Various devices can be formed over the substrate 202. For example, a FET device including a gate structure, a source structure and a drain structure can be disposed over the substrate 202, though not shown.

In some embodiments, the semiconductor structure 200d includes a plurality of conductive features 210a disposed over the substrate 202. It should be noted that the semiconductor structure 200d can include conductive features 210b or 210c, though not shown. In some embodiments, the semiconductor structure 200d includes an isolation structure between the conductive features 210a and separating the conductive features 210a from each other. In some embodiments, the isolation structure of the semiconductor structure 200d can include an air gap 220a, as shown in FIG. 14. In such embodiments, a liner 222 may serve as a bottom and sidewalls of the air gap 220a, and a dielectric structure 224 may serve as a cap of the air gap 220a. In other embodiments, the isolation structure of the semiconductor structure 200d can include a dielectric structure 220b, as shown in FIGS. 3, 5, 7 and 9. In such embodiments, the dielectric structure 220b can include a liner 222 and a low-k material structure 224.

In some embodiments, the semiconductor structure 200d can include a dielectric structure 230 over the conductive features 210a and the isolation structure. The semiconductor structure 200d further include an interconnect structure 242/250 disposed in the dielectric structure 230. The interconnect structure 242/250 can be a part of the BEM, connecting structure 130. The interconnect structure 242/250 include a conductive feature such as a via 242. Further, the interconnect structure 242/250 includes a conductive line 250 over and coupled to the via 242. As shown in FIG. 14, the conductive line 250 is coupled to the conductive feature 210a through the via 242.

In some embodiments, as shown in FIG. 14, the via 242 is formed to contact the 3D material layer 210-1 and the 3D material layer 252-2. In some embodiments, a contact resistance between the via 242 and the 3D material layers 210-1 and 252-2 can be further reduced when the via 242 and the 3D material layers 210-1 and 252-2 include a same material. In some embodiments, a barrier layer 246 can be disposed between the via 242 and the dielectric structure 230.

Further, the semiconductor structure 200d can include an isolation structure 260 disposed over the dielectric structure 230. The isolation structure 260 is used to provide electrical isolation between the conductive lines. In some embodiments, the isolation structure 260 can include an air gap, as shown in FIG. 14. In other embodiments, the isolation structure can include a dielectric material, as depicted by the isolation structure 220b shown in FIGS. 3, 5, 7 and 9.

In some embodiments, each of the conductive lines 250 includes a 3D material layer 252-1, a 2D material layer 254 and a 3D material layer 252-2. As shown in FIG. 14, the 2D material layer 254 is disposed between the 3D material layer 252-1 and the 3D material layer 252-2. Materials used to form the 2D material layer 254 and a thickness of the 2D material layer 254 can be similar to those described above; therefore, repeated descriptions of such details are omitted for brevity. Materials used to form the 3D material layers 252-1 and 252-2 can be similar to those described above therefore, repeated descriptions of such details are also omitted. In some embodiments, a thickness of the 2D material layer 254, a thickness of the 3D material layer 252-1 and a thickness of the 3D material layer 252-2 are similar. In some embodiments, the thickness of the 2D material layer 254 is greater than the thickness of the 3D material layer 252-1 and the thickness of the 3D material layer 252-2.

According to the semiconductor structure 200d shown in FIG. 14, the 2D material layer 254 is provided between the 3D material layers 252-1 and 252-2. When the thickness of the 2D material layer 254 is between approximately 0.2 nanometer and 1,000 nanometers, the resistance of the conductive feature 210a is less than that of a conductive feature including a pure 3D material layer. Therefore, the semiconductor structure 200d helps improving the scaling down of the IC.

Figure 15:
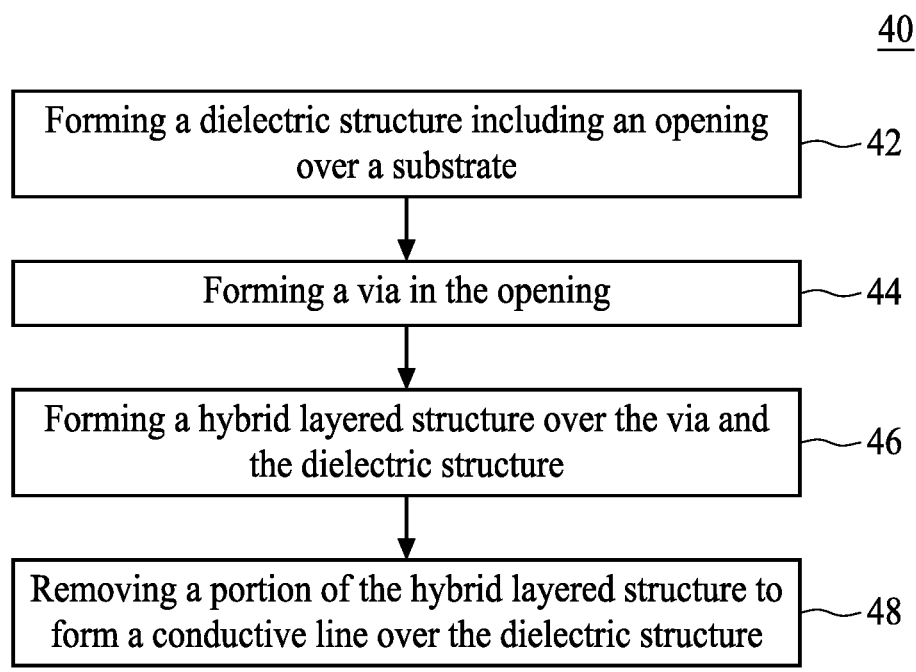
FIG. 15 is a flowchart of a method for forming a semiconductor structure according to various aspects of the present disclosure.

FIG. 15 is a flowchart representing a method for forming a semiconductor structure 40 according to aspects of the present disclosure. In some embodiments, the method for forming the semiconductor structure 40 can be used in a method for forming a semiconductor structure including a BEOL connecting structure mentioned above. In some embodiments, the method for forming the semiconductor structure 40 includes a number of operations (42, 44, 46 and 48). The methods for forming the semiconductor structure 40 will be further described according to one or more embodiments. It should be noted that the operations of the method 40 may be rearranged or otherwise modified within the scope of the various aspects. It should further be noted that additional processes may be provided before, during, and after the method 40, and that some other processes may be only briefly described herein.

In some embodiments, the method of forming the semiconductor structure 40 and the method of forming the semiconductor structure 30 can be integrated. In such embodiments, the method of forming the semiconductor structure 40 can be performed after the method of forming the semiconductor structure 30, but the disclosure is not limited thereto.

Figure 16A:
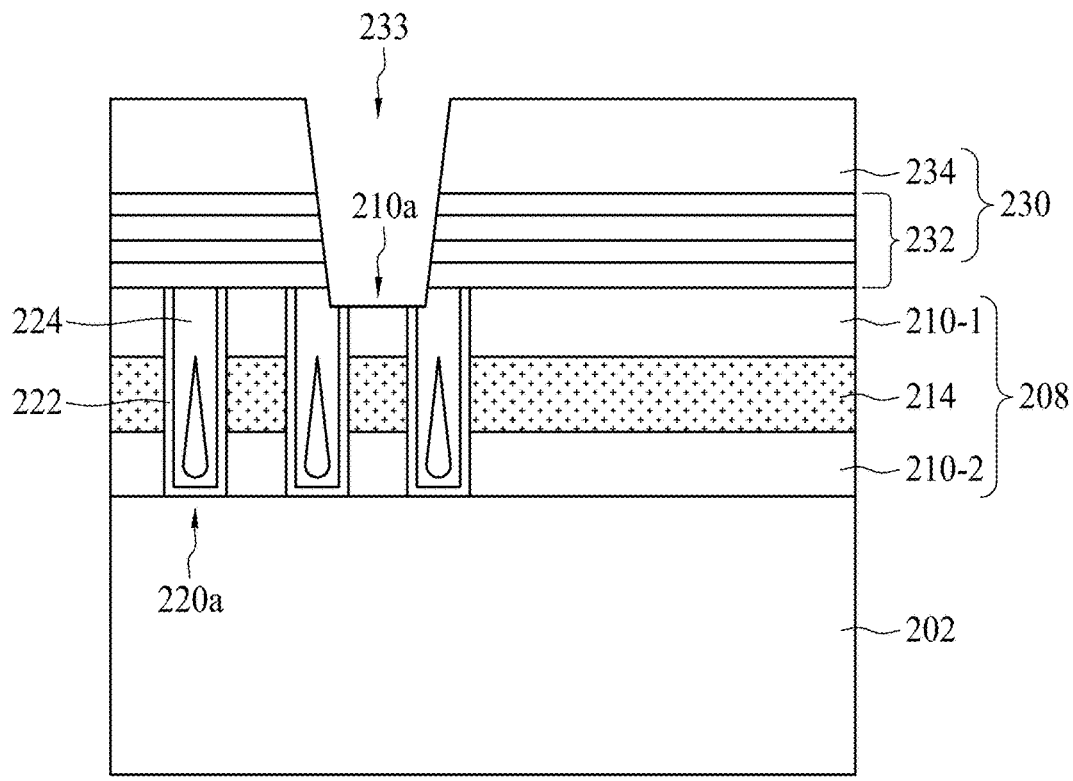
FIGS. 16A to 16D are schematic drawings illustrating various stages in a method for forming a semiconductor structure according to aspects of one or more embodiments of the present disclosure.

In some embodiments, in operation 42, a dielectric structure 230 is formed over a substrate 202. In some embodiments, a plurality of conductive features 210a separated from each other by an isolation structure 220a can be provided over the substrate 202. As mentioned above, by selecting the 2D material and the 3D material and arranging the formation operations, conductive features 210b or conductive features 210c can be formed over the substrate 202, though not shown. Also, as mentioned above, by adjusting the formation operation, the isolation structure can include an air gap 220a as shown in FIG. 16A, or can include a dielectric structure 220b as shown in FIGS. 3, 5, 7 and 9. The forming of the conductive features 210a and the forming of the isolation structures 220a can be similar to the operations of the method 30; therefore, repeated descriptions of such details are omitted.

In some embodiments, a via opening 233 can be formed in the dielectric structure 230. As shown in FIG. 16A, at least one of the conductive features 210a is exposed through a bottom of the via opening 233. In some embodiments, a width of the via opening 233 can be greater than a width of the conductive feature 210a, but the disclosure is not limited thereto.

Figure 16B:
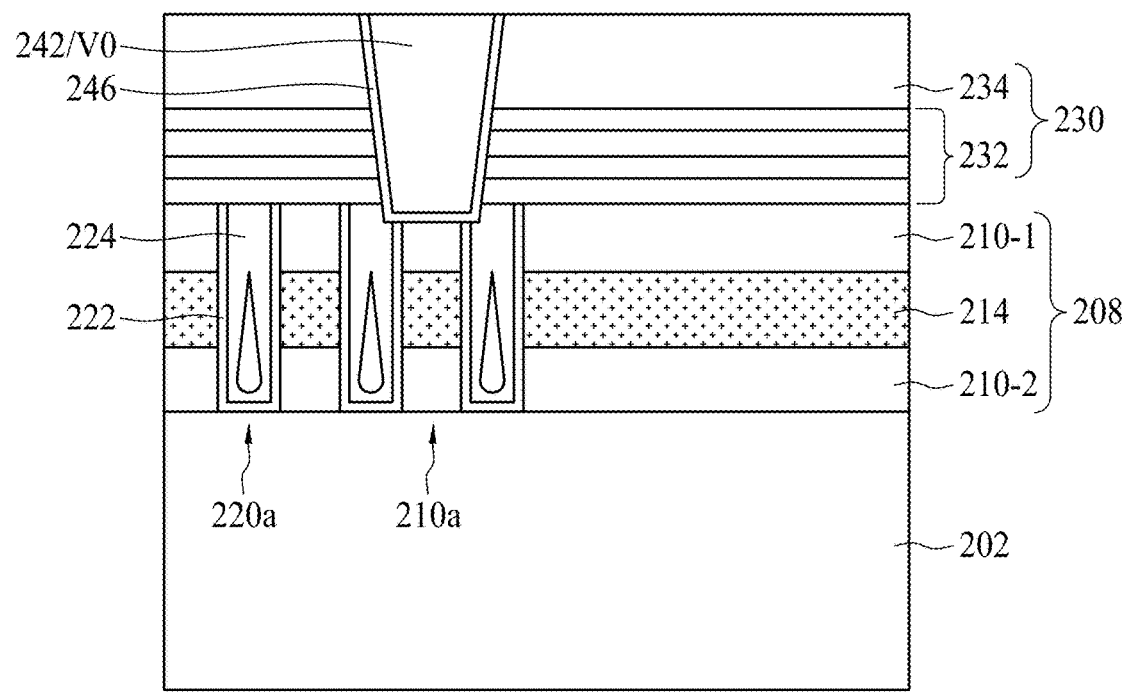

Referring to FIG. 16B, a barrier layer 246 can be conformally formed to cover a bottom and sidewalls of the via opening 233 and then the via opening 233 is filled with a conductive material. Superfluous portions of the conductive material and the barrier layer can be removed by a planarization such as a CMP operation. Consequently, a via 242 can be obtained in operation 44.

Figure 16C:
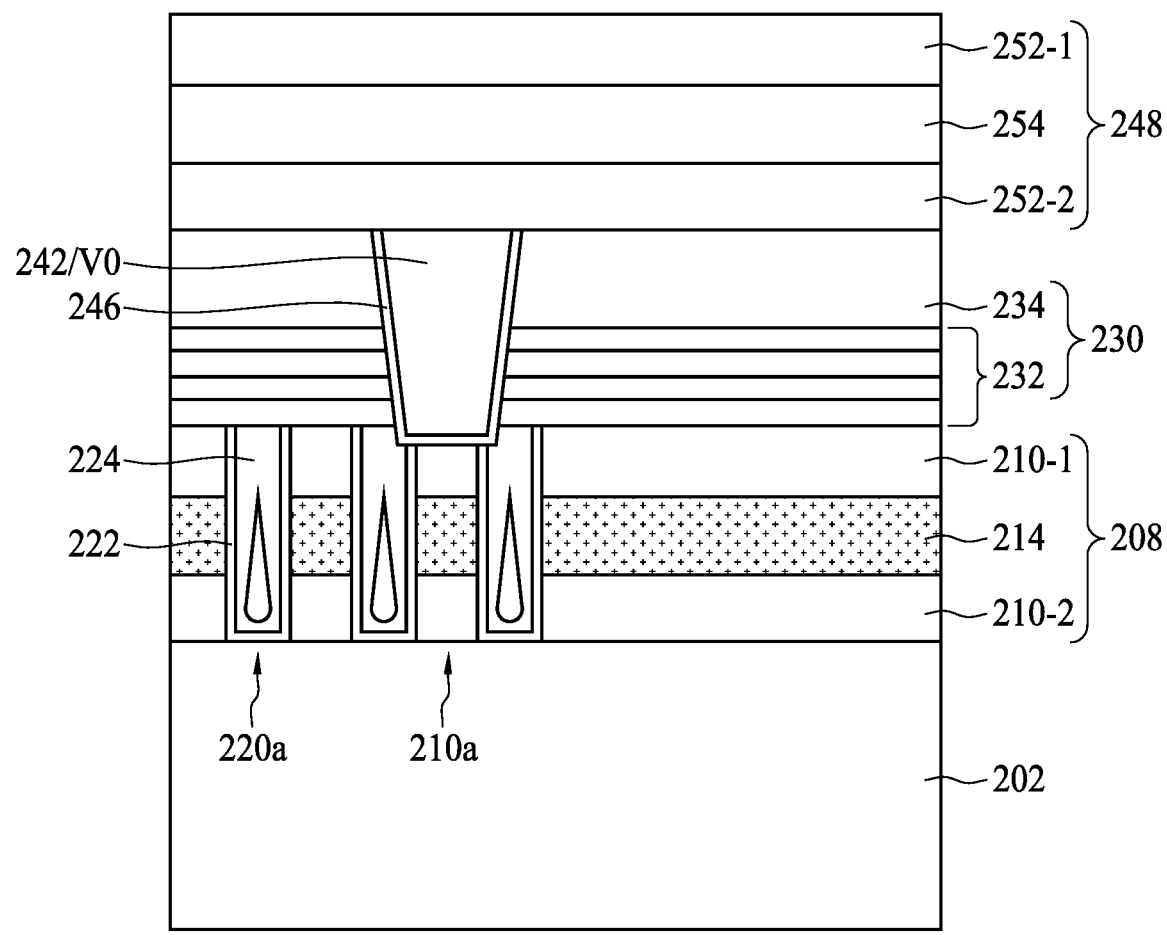

Referring to FIG. 16C, in operation 46, a hybrid layered structure 248 is formed over the via 242 and the dielectric structure 230. In some embodiments, the hybrid layered structure 248 can include 3D material layers 252-1 and 252-2, and a 2D material layer 254 between the 3D material layers 252-1 and 252-2. Materials used to form the 2D material layer 254 can be similar to those described above; therefore, repeated descriptions of such details are omitted.

Figure 16D:
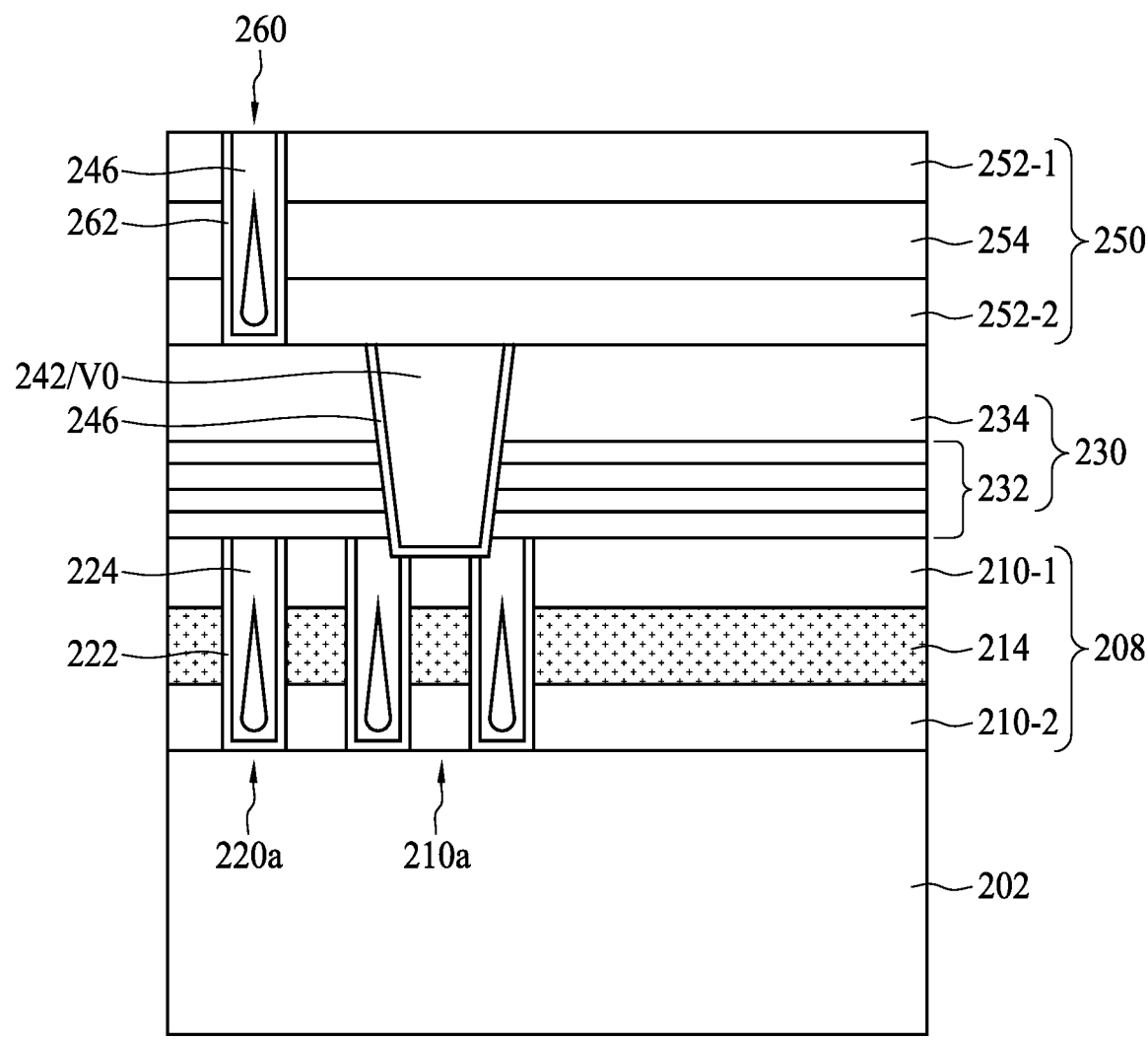

Referring to FIG. 16D, in operation 48, portions of the hybrid layered structure 248 are removed such that a plurality of conductive features 250 are formed. Further, openings (not shown) are formed between the conductive features 250. In some embodiments, an intercalation operation can be performed after the forming of the conductive features 250. The intercalation operation is performed such that the 2D material layer can include intercalation components, as shown in FIG. 16D. The intercalation components can be similar as those described above; therefore, repeated descriptions of such details are omitted for brevity.

In some embodiments, a liner 262 is formed to cover sidewalls and top surface of the conductive features 250. It should be noted that in some embodiments, the liner 262 can be formed after the intercalation operation. In other embodiments, the intercalation operation can be omitted and thus the liner 262 can be formed directly after the forming of the conductive features 250. Materials used to form the liner 262 can be similar to those described above; therefore, repeated descriptions of such details are omitted for brevity. The forming of the isolation structure further includes forming a dielectric structure 264 over the liner 262. Materials used to form the dielectric structure 264 can be similar to materials used to form the dielectric structure 224; therefore, repeated descriptions of such details are omitted for brevity. In some embodiments, the opening can be sealed by the dielectric structure 264. In some embodiments, superfluous portions of the dielectric structure 264 and the liner 262 can be removed by a planarization operation, such as a CMP operation. Consequently, an air gap 260 is formed within the opening. In some embodiments, the forming of the isolation structure includes filling the openings with the dielectric structure 264, and removing superfluous portions of the dielectric structure. Thus, a plurality of dielectric structures 260 including the opening-filling dielectric structure 224 and the liner 222 can be obtained.

Additionally, it should be noted that by selecting different 2D material and 3D material and arranging the operations for forming the 2D material layer and the 3D material layer, the conductive features 250 of the semiconductor structure 200d can have a layer arrangement similar to the layer arrangement of the conductive features 210b or 210c. In other words, the embodiments for forming the semiconductor structure provide flexibility for integrating the 2D material in the BEOL process.

In summary, the present disclosure provides a semiconductor structure and a method for forming the same. In some embodiments, the 2D materials are used to form the conductive feature of the semiconductor structure, such that increased-resistance issue of the semiconductor structure can be mitigated while reducing the device size. As mentioned above, the semiconductor structure including the 2D material can be used to form MEOL connecting structures, such as a contact or a plug, in other embodiments, the semiconductor structure including the 2D material can be used to form BEOL connecting structures such as conductive lines that are connected to each other by vias. It can be concluded that the semiconductor structure and method for forming the same improves 2D integration and feasibility in both MEOL and BEOL processes, while the 2D material serves as a promising material while reducing the device size.

In some embodiments, a method for forming a semiconductor structure is provided. The method includes following operations. A hybrid layered structure is formed over a substrate. In some embodiments, the hybrid layered structure includes at least a 2D material layer and a first 3D material layer. Portions of the hybrid layered structure are removed to form a plurality of conductive features and at least an opening between the conductive features. An isolation structure is formed in the opening.

In some embodiments, a method for forming a semiconductor structure is provided. The method includes following operations. A hybrid layered structure is formed. The hybrid layered structure includes at least a 2D material layer and a first 3D material layer. Portions of the hybrid layered structure are removed to form a plurality of conductive features and at least an opening between the conductive features. A dielectric material is formed to fill the opening and to form an air gap sealed within.

In some embodiments, a method for forming a semiconductor structure is provided. The method includes following operations. A dielectric structure is formed over a substrate. An opening is formed in the dielectric structure. A via is formed in the opening. A hybrid layered structure is formed over the via and the dielectric structure. The hybrid layered structure includes at 2D material layer and a first 3D material layer. A portion of the hybrid layered structure is removed to form a conductive feature over the dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a hybrid layered structure over a substrate, wherein the hybrid layered structure comprises at least a 2D material layer and a first 3D material layer;
   forming a patterned hard mask over the hybrid layered structure;
   removing portions of the hybrid layered structure to form a plurality of conductive features and at least an opening between the conductive features through the patterned hard mask;

forming a liner covering a top surface of the patterned hard mask; and forming an isolation structure in the opening.

2. The method of claim 1, wherein the hybrid layered structure further comprises a second 3D material layer, and the 2D material layer is between the first 3D material layer and the second 3D material layer.

3. The method of claim 1, wherein the forming of the isolation structure in the opening further comprises:

forming a dielectric material to seal the opening to form an air gap within the opening.

4. The method of claim 1, wherein the forming of the isolation structure in the opening further comprises filling the opening with a dielectric material.

5. The method of claim 1, further comprising:

forming a dielectric structure over the conductive features and the isolation structure; and forming an interconnect structure in the dielectric structure.

6. The method of claim 5, wherein the interconnect structure is in contact with at least one of the conductive feature.

7. The method of claim 5, wherein the interconnect structure is separated from the 2D material layer.

8. The method of claim 5, wherein the interconnect structure is in contact with the 2D material layer.

9. A method for forming a semiconductor structure, comprising:

forming a hybrid layered structure, wherein the hybrid layered structure comprises at least a 2D material layer and a first 3D material layer;

removing portions of the hybrid layered structure to form a plurality of conductive features and at least an opening between the conductive features;

performing an intercalation after the forming of the conductive features; and forming a dielectric material to fill the opening and to form an air gap sealed within.

10. The method of claim 9, wherein the hybrid layered structure further comprises a second 3D material layer, and the 2D material layer is between the first 3D material layer and the second 3D material layer.

11. The method of claim 10, wherein the first 3D material layer and the second 3D material layer comprise a same material.

12. The method of claim 9, further comprising forming a liner covering sidewalls and a bottom of the opening prior to the forming of the dielectric material.

13. The method of claim 9, further comprising:

forming a dielectric structure over the conductive features and the dielectric material; and forming an interconnect structure in the dielectric structure.

14. The method of claim 13, wherein the interconnect structure is in contact with at least one of the conductive features.

15. The method of claim 13, wherein the interconnect structure is separated from the air gap.

16. A method for forming a semiconductor structure, comprising:

forming a dielectric structure over a substrate, wherein an opening is formed in the dielectric structure;

forming a via in the opening;

forming a hybrid layered structure over the via and the dielectric structure, wherein the hybrid layered structure comprises a 2D material layer, a first 3D material layer and a second 3D material layer, and the 2D material layer is between the first 3D material layer and the second 3D material layer; and removing a portion of the hybrid layered structure to form a first conductive feature over the dielectric structure, wherein a width of the first 3D material layer, a width of the 2D material layer and a width of the second 3D material layer of the first conductive feature are the same.

17. The method of claim 16, further comprising forming an isolation structure adjacent to the conductive feature.

18. The method of claim 17, wherein the isolation structure comprises a low-k dielectric structure and/or an air gap isolation structure.

19. The method of claim 17, wherein the isolation structure is separated from the via.

20. The method of claim 16, further comprising a second conductive feature disposed over the substrate, wherein a bottom surface of the opening is lower than a top surface of the second conductive feature.

* * * * *